(12) United States Patent
Chou et al.

(10) Patent No.: US 9,087,036 B1
(45) Date of Patent: Jul. 21, 2015

(54) METHODS AND APPARATUSES FOR TIME ANNOTATED TRANSACTION LEVEL MODELING

(75) Inventors: Chien-Chun Chou, Saratoga, CA (US); Alan Kamas, Sunnyvale, CA (US)

(73) Assignee: Sonics, Inc., Milpitas, CA (US)

( * ) Notice: Subject to any disclaimer, the term of this patent is extended or adjusted under 35 U.S.C. 154(b) by 937 days.

(21) Appl. No.: 11/203,554

(22) Filed: Aug. 11, 2005

Related U.S. Application Data

(60) Provisional application No. 60/601,519, filed on Aug. 12, 2004.

(51) Int. Cl.
| | |
|---|---|
| G06F 17/50 | (2006.01) |
| G06G 7/62 | (2006.01) |
| G06F 11/26 | (2006.01) |
| G06F 12/06 | (2006.01) |

(52) U.S. Cl.
CPC .......... *G06F 11/261* (2013.01); *G06F 17/5031* (2013.01); *G06F 12/0607* (2013.01)

(58) Field of Classification Search
CPC .............. G06F 11/261; G06F 12/0607; G06F 17/5031; G06F 15/17375
USPC ..................................................... 703/23–25
See application file for complete search history.

(56) References Cited

U.S. PATENT DOCUMENTS

| | | |
|---|---|---|
| 4,189,767 A | 2/1980 | Ahuja |
| 4,375,097 A | 2/1983 | Ulug |
| 4,393,470 A | 7/1983 | Miard |
| 4,476,498 A | 10/1984 | Sheean |
| 4,688,188 A | 8/1987 | Washington |
| 5,107,257 A | 4/1992 | Fukuda |
| 5,218,456 A | 6/1993 | Stegbauer et al. |
| 5,265,257 A | 11/1993 | Simcoe et al. |
| 5,274,769 A | 12/1993 | Ishida |
| 5,287,464 A | 2/1994 | Kumar et al. |
| 5,363,484 A | 11/1994 | Desnoyers et al. |
| 5,379,379 A | 1/1995 | Becker et al. |
| 5,440,752 A | 8/1995 | Lentz et al. |

(Continued)

FOREIGN PATENT DOCUMENTS

| | | |
|---|---|---|
| EP | 1678620 | 6/2011 |
| JP | 5-12011 | 1/1993 |

(Continued)

OTHER PUBLICATIONS

Haverinen, "White Paper for SystemC based SoC Communication Modeling for the OCP Protocol", 2002, ICPIP, V1.0—Oct. 14, 2002. pp. 39.*

(Continued)

*Primary Examiner* — Aniss Chad
(74) *Attorney, Agent, or Firm* — Rutan & Tucker, LLP

(57) ABSTRACT

A method and apparatus for transaction level modeling where communications occur between modules in the system that contain time annotations is described. An apparatus includes an initiator module, a target module, and a communications channel with each being modeled as an executable behavioral model. The communications channel transports burst information between the initiator module and the target module. The communications channel has a timing variable function to store timing variables and derive timing information associated with each individual transfer within a burst transaction during a simulation.

20 Claims, 12 Drawing Sheets

(56) References Cited

U.S. PATENT DOCUMENTS

| | | |
|---|---|---|
| 5,469,433 A | 11/1995 | McAuley |
| 5,469,473 A | 11/1995 | McClear et al. |
| 5,530,901 A | 6/1996 | Nitta |
| 5,546,546 A | 8/1996 | Bell et al. |
| 5,557,754 A | 9/1996 | Stone et al. |
| 5,634,006 A | 5/1997 | Baugher et al. |
| 5,664,153 A | 9/1997 | Farrell |
| 5,673,416 A | 9/1997 | Chee et al. |
| 5,708,659 A | 1/1998 | Rostoker et al. |
| 5,745,913 A | 4/1998 | Pattin et al. |
| 5,748,629 A | 5/1998 | Caldara et al. |
| 5,781,918 A | 7/1998 | Lieberman et al. |
| 5,809,538 A | 9/1998 | Pollmann et al. |
| 5,872,773 A | 2/1999 | Katzela et al. |
| 5,917,804 A | 6/1999 | Shah et al. |
| 5,926,649 A | 7/1999 | Ma et al. |
| 5,948,089 A | 9/1999 | Wingard et al. |
| 5,982,780 A | 11/1999 | Bohm et al. |
| 5,996,037 A | 11/1999 | Emnett |
| 6,023,720 A | 2/2000 | Aref et al. |
| 6,092,137 A | 7/2000 | Huang et al. |
| 6,104,690 A | 8/2000 | Feldman et al. |
| 6,105,094 A | 8/2000 | Lindeman |
| 6,119,183 A | 9/2000 | Briel et al. |
| 6,122,690 A | 9/2000 | Nannetti et al. |
| 6,141,355 A | 10/2000 | Palmer et al. |
| 6,141,713 A | 10/2000 | Kang |
| 6,167,445 A | 12/2000 | Gai et al. |
| 6,182,183 B1 | 1/2001 | Wingard et al. |
| 6,198,724 B1 | 3/2001 | Lam et al. |
| 6,199,131 B1 | 3/2001 | Melo et al. |
| 6,212,611 B1 | 4/2001 | Nizar et al. |
| 6,215,789 B1 | 4/2001 | Keenan et al. |
| 6,215,797 B1 | 4/2001 | Fellman et al. |
| 6,249,144 B1 | 6/2001 | Agrawal et al. |
| 6,253,269 B1 | 6/2001 | Cranston et al. |
| 6,266,718 B1 | 7/2001 | Klein |
| 6,330,225 B1 | 12/2001 | Weber et al. |
| 6,335,932 B2 | 1/2002 | Kadambi et al. |
| 6,363,445 B1 | 3/2002 | Jeddeloh |
| 6,393,500 B1 | 5/2002 | Thekkath |
| 6,430,156 B1 | 8/2002 | Park et al. |
| 6,466,825 B1 | 10/2002 | Wang et al. |
| 6,487,621 B1 | 11/2002 | MacLaren |
| 6,499,090 B1 | 12/2002 | Hill et al. |
| 6,510,497 B1 | 1/2003 | Strongin et al. |
| RE37,980 E | 2/2003 | Elkhoury et al. |
| 6,526,462 B1 | 2/2003 | Elabd |
| 6,530,007 B2 | 3/2003 | Olarig et al. |
| 6,578,117 B2 | 6/2003 | Weber |
| 6,628,609 B2 | 9/2003 | Chapman et al. |
| 6,636,482 B2 | 10/2003 | Cloonan et al. |
| 6,678,645 B1 * | 1/2004 | Rajsuman et al. ............ 703/20 |
| 6,683,474 B2 | 1/2004 | Ebert et al. |
| 6,721,325 B1 | 4/2004 | Duckering et al. |
| 6,725,313 B1 | 4/2004 | Wingard et al. |
| 6,785,753 B2 | 8/2004 | Weber et al. |
| 6,804,738 B2 | 10/2004 | Weber |
| 6,804,757 B2 | 10/2004 | Weber |
| 6,816,814 B2 | 11/2004 | Ebert et al. |
| 6,862,265 B1 | 3/2005 | Appala et al. |
| 6,874,039 B2 | 3/2005 | Ganapathy et al. |
| 6,877,076 B1 | 4/2005 | Cho et al. |
| 6,880,133 B2 | 4/2005 | Meyer et al. |
| 6,882,966 B2 * | 4/2005 | Ryu et al. ............... 703/14 |
| 6,976,106 B2 | 12/2005 | Tomlinson et al. |
| 7,050,958 B1 | 5/2006 | Bortfeld et al. |
| 7,062,423 B1 * | 6/2006 | Sheredy ............... 703/13 |
| 7,116,131 B1 | 10/2006 | Chirania et al. |
| 7,120,712 B2 | 10/2006 | Wingard et al. |
| 7,120,765 B2 | 10/2006 | Dodd et al. |
| 7,149,829 B2 | 12/2006 | Weber et al. |
| 7,155,554 B2 | 12/2006 | Vinogradov et al. |
| 7,191,273 B2 | 3/2007 | Weber |
| 7,194,561 B2 | 3/2007 | Weber |
| 7,194,566 B2 | 3/2007 | Wingard et al. |
| 7,194,658 B2 | 3/2007 | Staton et al. |
| 7,254,603 B2 | 8/2007 | Weber et al. |
| 7,266,786 B2 | 9/2007 | Chou et al. |
| 7,277,975 B2 | 10/2007 | Vinogradov et al. |
| 7,296,105 B2 | 11/2007 | Weber et al. |
| 7,299,155 B2 | 11/2007 | Ebert et al. |
| 7,302,691 B2 | 11/2007 | Masri et al. |
| 7,325,221 B1 | 1/2008 | Wingard et al. |
| 7,356,633 B2 | 4/2008 | Weber et al. |
| 7,543,088 B2 | 6/2009 | Weber et al. |
| 7,543,093 B2 | 6/2009 | Chou et al. |
| 7,552,292 B2 | 6/2009 | Hsieh et al. |
| 7,574,629 B2 | 8/2009 | Douady et al. |
| 7,587,535 B2 | 9/2009 | Sawai |
| 7,590,815 B1 | 9/2009 | De Waal |
| 7,598,726 B1 | 10/2009 | Tabatabaei |
| 7,665,069 B2 | 2/2010 | Weber |
| 7,852,343 B2 | 12/2010 | Tanaka et al. |
| 7,899,953 B2 | 3/2011 | Inoue |
| 8,108,648 B2 | 1/2012 | Srinivasan et al. |
| 2001/0026535 A1 | 10/2001 | Amou et al. |
| 2002/0038397 A1 | 3/2002 | Singh et al. |
| 2002/0083256 A1 | 6/2002 | Pannell |
| 2002/0129173 A1 | 9/2002 | Weber et al. |
| 2002/0129210 A1 | 9/2002 | Arimilli et al. |
| 2002/0138687 A1 | 9/2002 | Yang et al. |
| 2002/0152297 A1 | 10/2002 | Lebourg et al. |
| 2002/0174227 A1 | 11/2002 | Hartsell et al. |
| 2003/0004699 A1 | 1/2003 | Choi et al. |
| 2003/0023794 A1 | 1/2003 | Venkitakrishnan et al. |
| 2003/0074519 A1 | 4/2003 | Weber |
| 2003/0074520 A1 | 4/2003 | Weber |
| 2003/0079080 A1 | 4/2003 | DeMoney |
| 2003/0088721 A1 | 5/2003 | Sharma |
| 2003/0208614 A1 | 11/2003 | Wilkes |
| 2004/0010652 A1 | 1/2004 | Adams et al. |
| 2004/0153928 A1 | 8/2004 | Rohrbaugh et al. |
| 2004/0177186 A1 | 9/2004 | Wingard et al. |
| 2005/0086412 A1 | 4/2005 | Douady et al. |
| 2005/0117589 A1 | 6/2005 | Douady et al. |
| 2005/0141505 A1 | 6/2005 | Douady et al. |
| 2005/0144585 A1 | 6/2005 | Daw et al. |
| 2005/0157717 A1 | 7/2005 | Douady et al. |
| 2005/0210164 A1 | 9/2005 | Weber et al. |
| 2005/0210325 A1 | 9/2005 | Douady et al. |
| 2006/0047890 A1 | 3/2006 | Van De Waerdt |
| 2006/0218315 A1 | 9/2006 | Okajima et al. |
| 2006/0225015 A1 | 10/2006 | Synek et al. |
| 2006/0242525 A1 | 10/2006 | Hollander et al. |
| 2007/0038791 A1 | 2/2007 | Subramanian et al. |
| 2007/0083830 A1 | 4/2007 | Hamilton et al. |
| 2007/0094429 A1 | 4/2007 | Wingard et al. |
| 2007/0110052 A1 | 5/2007 | Kok et al. |
| 2008/0028090 A1 | 1/2008 | Kok et al. |
| 2008/0086577 A1 | 4/2008 | Huang |
| 2008/0235421 A1 | 9/2008 | Jayaratnam et al. |
| 2008/0320254 A1 | 12/2008 | Wingard et al. |
| 2008/0320255 A1 | 12/2008 | Wingard et al. |
| 2008/0320268 A1 | 12/2008 | Wingard et al. |
| 2008/0320476 A1 | 12/2008 | Wingard et al. |
| 2009/0235020 A1 | 9/2009 | Srinivasan et al. |
| 2010/0042759 A1 | 2/2010 | Srinivasan et al. |
| 2010/0211935 A1 | 8/2010 | Weber et al. |

FOREIGN PATENT DOCUMENTS

| | | |
|---|---|---|
| JP | 11-191075 | 7/1999 |
| JP | H11-250004 | 9/1999 |
| JP | 2000-250853 | 9/2000 |
| JP | 2006-277404 | 10/2006 |
| JP | 5144934 | 11/2012 |
| KR | 10-1196048 | 10/2012 |
| WO | WO 00/29956 | 5/2000 |
| WO | WO 01/75620 | 10/2001 |
| WO | WO 0193477 A1 | 12/2001 |
| WO | WO03/034242 | 4/2003 |
| WO | WO2005/045727 | 5/2005 |
| WO | WO2009/002998 | 12/2008 |

(56) References Cited

FOREIGN PATENT DOCUMENTS

OTHER PUBLICATIONS

Black, Co-Founder, "Eklectic Ally Electronic Systems Solutions", SystemC 2.1 Preview—DAC2004, www.EklecticAlly.com, info@EklecticAlly.com, Version 1.0, Copyright 2003, pp. 12.
Paul Klein et al., "Passive TLM", Intel Corporation, Paul.J. Klein@intel.com, Zafer.Kadi@intel.com, Jun. 7, 2004, pp. 16.
Wilson Snyder, "Verilator and SystemPerl", Sun Microsystems, VeriPool, wsnyder@wsnyder.org, http://www.veripool.com, Jun. 2004, pp. 14.
Sofiene Tahar, "Assertion and Model Checking of SystemC", Hardware Verification Group, Department of Electrical and Computer Engineering, Concordia University Montreal, Quebec, Canada, First Annual North American SystemC Users Group (NASCUG) Meeting, Jun. 7, 2004, pp. 28.
Stuart Swan, Senior Architect, "SystemC-Towards a SystemC Transaction Level Modeling Standard", Cadence Design Systems, Inc., Jun. 2004 pp. 12.
Brian McMurtrey et al., "SystemC Enabling Embedded System Design at Sandia", Sandia National Laboratories, Apr. 14, 2004, pp. 11.
Alan Kamas. "Dot.org—Open Core Protocol: The SystemC Models" article, published in Apr./May 2004 issue of Chip Design Magazine, http://www.chipdesignmag.com/print.php?articleId=28?issueId=4, pp. 2.
Alan Kamas, "The SystemC OCP Models, An Overview of the SystemC Models for the Open Core Protocol", NASCUG Sep. 29, 2004, Copyright Alan Kamas 2004, www. karnas.com, pp. 30.
2nd NASCUG Meeting Agenda, Meeting Presentations, GSPx 2004, Santa Clara, CA U.S.A., Sep. 29, 2004, http://www.nascug.org/nascug2004_fall.agenda.html, North American SystemC Users Group, pp. 2.
Alexanian, H., Bolden, G., Amir, Z., "Simplifying the Behavior of System C Descriptions for Hardware/Software Covalidation," copyright 2005 [retrieved Apr. 26, 2008] Retreived from the Internet. <URL: www.ocpip.org/pressroom/schedule/speaking/papers_presentations/Summit_OCP-IP_pavillion_pres.pps>.
G Maruccia et al., "OCCN On-Chip-Communication-Network" From On-Chip bus to Network-on-Chip, a unique modeling framework, Advanced System Technology STMicroelectronics, Jun. 7, 2004, pp. 12.
Bakr Younis et al., "Operating System for Switched Analog Mixed-Signal Circuits", The Ohio State University Department of Electrical and Computer Engineering Design Automation Research Lab (DARL), Jun. 7, 2004, pp. 12.
Richard Ruigrok, "Hardware-Software Co-Simulation with System C", Qualcomm Incorporated, Jun. 7, 2004, pp. 17.
"1$^{st}$ NASCUG Meeting", Meeting Presentations, http:\\www.nascug.org/nascug2004_spring.html North American SystemC Users Group, Jun. 7, 2004, pp. 2.
Cottrell, Donald, Chapter 78: "Design Automation Technology Roadmap", The VLSI Handbook, Copyright 2000, 41 Pages.
Gupta, Sumit and Gupta, Rajesh K., Chapter 64: "ASIC Design", The VLSI Handbook, Copyright 2000, 29 pages.
Hurst, Stanley L., Chapter 5: "Computer Aided Design", VLSI Custom Microelectronics: Digital, Analog, and Mixed-Signal, Copyright 1999, 95 pages.
United States Patent & Trademark Office, memo from Love, John J., Deputy Commissioner for Patent Examination Policy, entitled, "Clarification of Interim Guidelines for Examination of Patent Applications for Subject Matter Eligibility", Apr. 12, 2007, 2 pgs.
"Open Core Protocol (OCP)", Wikipedia, the free encyclopedia, http://en.wikipedia.org/wiki/Open_Core_Protocol, Feb. 9, 2009, 2 pages.
"Open Core Protocol", search query on Trademark Electronic Search System (TESS), United States Trademark and Patent Office, Feb. 7, 2009, 2 pages.
"Open Core Protocol", results of search query on Trademark Electronic Search System (TESS), United States Trademark and Patent Office, Feb. 7, 2009, 2 pages.
"Open Core Protocol Transaction Level 2", search query on Trademark Electronic Search System (TESS), United States Trademark and Patent Office, Feb. 7, 2009, 2 pages.
"Open Core Protocol Transaction Level 2", results of search query on Trademark Electronic Search System (TESS), United States Trademark and Patent Office, Feb. 7, 2009, 2 pages.
"SystemC", search query on Trademark Electronic Search System (TESS), United States Trademark and Patent Office, Feb. 7, 2009, 2 pages.
"SystemC", results of search query on Trademark Electronic Search System (TESS), United States Trademark and Patent Office, Feb. 7, 2009, 2 pages.
"SystemC", Wikipedia, the free encyclopedia, http://en.wikipedia.org/wiki/SystemC, Feb. 9, 2009, 6 pages.
U.S. Appl. No. 11/203,554, filed Aug. 11, 2005, Chou et al.
U.S. Appl. No. 13/276,041, filed Oct. 18, 2011, Wingard et al.
Non-Final Office Action for U.S. Appl. No. 12/706,656, mailed Feb. 15, 2012, 26 pages. U.S. Patent and Trademark Office, Alexandria, Virginia, USA.
Final Office Action for U.S. Appl. No. 12/706,656, mailed Jul. 25, 2012, 37 pages. U.S. Patent and Trademark Office, Alexandria, Virginia, USA.
Advisory Action for U.S. Appl. No. 12/706,656, mailed Nov. 15, 2012, 4 pages. U.S. Patent and Trademark Office, Alexandria, Virginia, USA.
Zhang, Hui, "Service Disciplines for Guaranteed Performance Service in Packet-Switching Networks" Proceedings of the IEEE, vol. 83, No. 10, pp. 1374-1396. Oct. 1995, DOI: 10.1109/5.469298.
Non-Final Office Action for U.S. Appl. No. 12/144,883, mailed Jun. 28, 2012, 9 pages. U.S. Patent and Trademark Office, Alexandria, Virginia, USA.
Notice of Allowance for U.S. Appl. No. 12/144,883, mailed Nov. 21, 2012, 10 pages. U.S. Patent and Trademark Office, Alexandria, Virginia, USA.
Search Report and Written Opinion for International Patent Application No. PCT/US2008/068107, mailed Oct. 8, 2008 International Searching Authority/US, Alexandria, Virginia USA.
International Preliminary Report on Patentability for International Patent Application No. PCT/US2008/068107, mailed Feb. 1, 2010, 7 pages. The International Bureau of WIPO, Geneva, Switzerland.
Office Action for European Patent Application No. 04 796 678.3-2416 dated Dec. 14, 2007, 4 pages. European Patent Office, Munich, Germany.
Office Action for European Patent Application No. 04 796 678.3-2416 dated Mar. 27, 2009, 4 pages. European Patent Office, Munich, Germany.
Summons to Oral Proceedings for European Patent Application No. 04 796 678.3-2416 dated Aug. 4, 2010, 7 pages. European Patent Office, Munich, Germany.
Office Action for Japanese Patent Application No. 2006-538262 mailed Dec. 6, 2010, 3 pages. Japan Patent Office.
Office Action for Japanese Patent Application No. 2006-538262 mailed Jan. 31, 2012, 16 pages. Japan Patent Office.
Notice to File a Response (Office Action) for Korean Patent Application No. 10-20067010659 mailed Feb. 16, 2011, 3 pages. Korean Intellectual Property Office.
Final Preliminary Rejection (Office Action) for Korean Patent Application No. 10-20067010659 mailed Oct. 18, 2011, 6 pages. Korean Intellectual Property Office.
Supplementary (Extended) Search Report for European Patent Application No. 08780967 dated Dec. 21, 2010, 4 pages. European Patent Office at The Hague, Netherlands.
Ahn, Jung Ho, et al., "The Design Space of Data-Parallel Memory Systems", IEEE, 12 pages, Nov. 2006.
"Intel Dual-Channel DDR Memory Architecture" White Paper Informational Brochure, Infineon Technologies North America Corporation and Kingston Technolgy Company, Inc., 14 pages, Sep. 2003.
OCP (Open Core Protocol) Specification, Release 2.0, OCP International Partnership, OCP-IP Association, 210 pages, 2003.

(56) References Cited

OTHER PUBLICATIONS

Weber, Wolf-Dietrich, et al., "A Quality-of-Search Mechanism for Interconnection Networks in System-on-Chips", Section 1530-1591/05, IEEE, 6 pages, 2005.
Weber, Wolf-Dietrich, "Efficient Shared DRAM Subsystems for SOCs", Sonics, Inc. Systems on the ICs, 6 pages, 2001.
Wingard, Drew, "A Non-Blocking Intelligent Interconnect for AMBA-Connected SoCs", Sonics, Inc., CoWare Arm Developer's Conference, 39 pages, Oct. 6, 2005.
Wingard, Drew, "Socket-Based Design Using Decoupled Interconnects", Interconnect-Centric Design for Advanced SOC and NOC, 30 pages, 2002.
Wingard, Drew, Sonics SOC Integration Architecture Presentation, Systems-ON-ICS, 25 pages, Jan. 28, 1999.
Wingard, Drew, "Tiles: The Heterogeneous Processing Abstraction for MPSoc Presentation", Sonics, Smart Interconnect IP, 35 pages, Jul. 7, 2004.
"IEEE 100: The Authoritative Dictionary of IEEE Standards Terms", 2000, IEEE, 7$^{th}$ Edition, IEEE Standard 100-2000, pp. 570 and 693.
Reisslein et al., "A Framework for Guaranteeing Statistical QoS", In IEEE/ACM Transactions on Networking, vol. 10, No. 1, Feb. 2002, pp. 27-42, 16 pages.
Stiliadis et al., "Latency-Rate Servers: A General Model for Analysis of Traffic Scheduling Algorithms", In Proceedings of IEEE Infocom 96, Apr. 1996, pp. 111-119, 9 pages.
Goossens et al., "Networks on Silicon: Combining Best-Effort and Guaranteed Services", In Proceeding of 2002 Design, 3 pages.
Rijpkema et al., "Trade Offs in the Design of a Router with Both Guaranteed and Best-Effort Services for Networks on Chip", In Proceedings of Design Automation and Test Conference in Europe, Mar. 2003, 6 pages.
Lahiri, K., et al., "LOTTERYBUS: A New High-Performance Communication Architecture for System-on-Chip Designs". In Proceedings of Design Automation Conference 2003, Las Vegas, Jun. 2001, pp. 15-20, 6 pages.
Dally, William J., "Virtual-channel Flow Control", In Proceedings of the 17th Int. Symp. on Computer Architecture, ACM SIGARCH, May 1990, vol. 18, No. 2, pp. 60-68, 9 pages.
Wingard, Drew, et al., "Integration Architecture for System-on-a-Chip Design", In Proc. of the 1998 Custom Integrated Circuits Conference, May 1998, pp. 85-88, 4 pages.
Jantsch, Axel, et al., "Networks on Chip", Kluwer Academic Publishers, 2003. Cover, Title Page, Contents, (4 pp.) Chapters 1-5, (pp. 3-106,) Chapters 7-8, (pp. 131-172) & Chapter 10, (pp. 193-213), 170 pages.
Weber, Wolf-Dietrich, et al., "Enabling Reuse via an IP Core-centric Communications Protocol: Open Core Protocol", In Proceedings of the IP 2000 System-on-Chip Conference Mar. 2000, pp. 1-5.
Adan et al., "Queueing Models and some Fundamental Relations", Chapter 3, XP-002329104, Feb. 14, 2001, pp. 23-27 (double-sided copy).
Lamport, Leslie, "How to Make a Multiprocessor Computer that Correctly Executes Multiprocess Programs", XP-009029909, IEEE Transactions on Computers, vol. C-28, No. 9, Sep. 1979, pp. 690-691 (double-sided copy).
Rixner, Scott, et al., "MemoryAccess Scheduling", to appear in ISCA27 (2000), Computer Systems Laboratory, Stanford University, Stanford, CA 94305 pp. 1-11.
Rixner, et al., "A Bandwidth-Efficient Architecture for Media Processing", Micro-31, (1998), pp. 1-11.
Wingard, Drew, "Tiles—An Architectural Abstraction for Platform-Based Design," Perspective article 2, EDAVision, Jun. 2002, 3 pages, www.edavision.com.
"Open Core Protocol Specification," OCP International Partnership, Release 1.0, 2001, 2 pgs.
Wingard, Drew, PhD., "Integrating Semiconductor IP Using μ Networks," ASIC Design, Jul. 2000 electronic engineering, 3 pages.
Chou, Joe, "System-Level Design Using OCP Based Transaction-Level Models," presentation, Denali MemCom Taiwan 2005, OCP International Partnership, 23 pages.
Casini, Phil, "Measuring the Value of Third Party Interconnects," Sonics, Inc., White Paper, 2005, 11 pages, www.sonicsinc.com.
Hardware Verification Group, "SystemC Verification Problematic", System-on-Chip Verification <http://hvg.ece.concordia.ca/Research/SoC/>, 2004, pp. 26.
De Meer, H.; Richter, J.-P.; Puliafito, A.; Tomarchio, O., "Tunnel agents for enhanced Internet QoS," Concurrency, IEEE, vol. 6, No. 2, pp. 30-39, Apr.-Jun. 1998, URL: http//ieeexplore.ieee.org/stamp/stamp.jsp?arnumber=678787&isnumber=14923.
Melvin, S. and Patt, Y. 2002. Handling of packet dependencies: a critical issue for highly parallel network processors. In Proceedings of the 2002 international Conference on Compilers, Architecture, and Synthesis for Embedded Systems (Grenoble, France, Oct. 8-11, 2002). Cases '02. ACM, New York, NY, 202-209.
Wingard, Drew, "MicroNetworks-Based Integration for SOCs." In Design Automation Conference, 2001, pp. 673-677, 5 pages.
Wielage et al., "Networks on Silicon: Blessing or Nightmare?" Keynote speech Proceedings of the Euromicro Symposium on Digital System Design, Dortmund, Germany, Sep. 2002, 5 pages.
Ho et al., "The Future of Wires". In Proceedings of the IEEE, vol. 89, No. 4, pp. 490-504, Apr. 2001, 15 pages.
Dally et al., "Route Packets, Not Wires: On-Chip Interconnection Networks." In Design Automation Conference, pp. 684-689, Jun. 2001, 6 pages.
Benini et al., "Networks on Chips: A New SoC Paradigm", In IEEE 2002, Computer, vol. 35, No. 1, pp. 70-78, 9 pages.
Kurose, "Open Issues and Challenges in Providing Quality of Service Guarantees in High-Speed Networks", ACM Computer Communication Review, vol. 23, No. 1, pp. 6-15, Jan. 1993, 10 pages.

\* cited by examiner

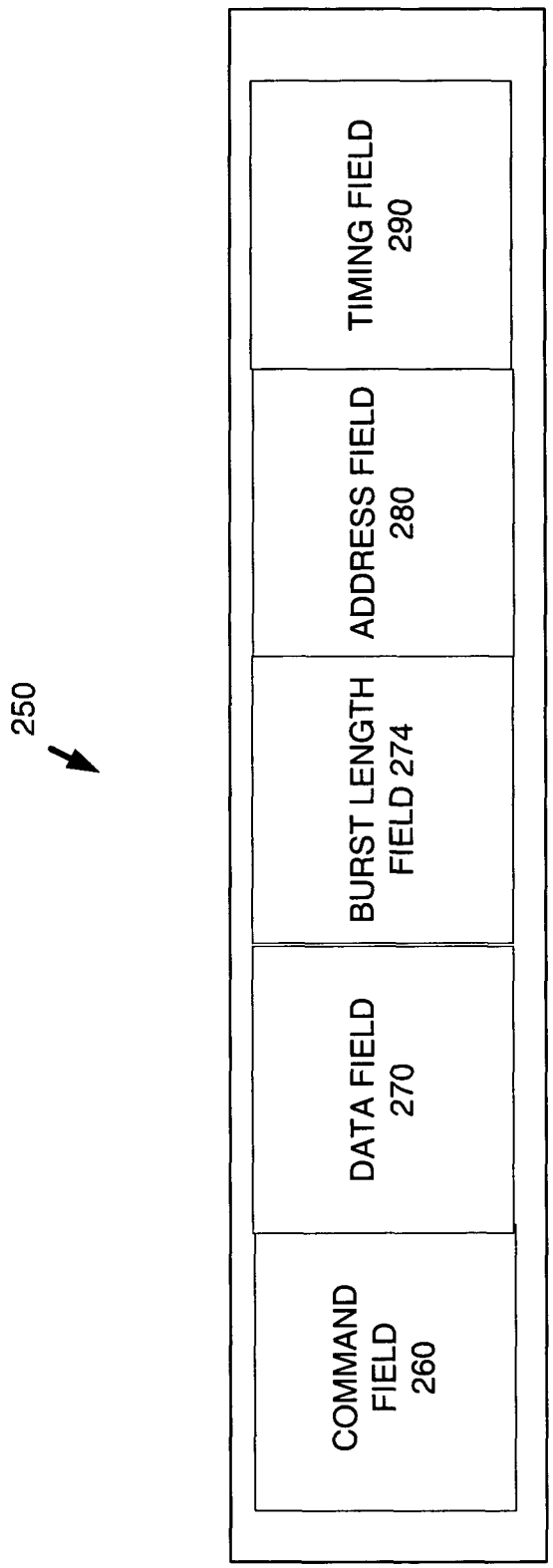

METHODS AND APPARATUSES FOR TIME ANNOTATED TRANSACTION LEVEL MODELING

RELATED APPLICATIONS

This application claims the benefit of and priority to provisional application No. 60/601,519 that was filed on Aug. 12, 2004 and is entitled, "VARIOUS METHODS AND APPARATUSES FOR TIME ANNOTATED TRANSACTION LEVEL MODELING.

FIELD OF THE INVENTION

Aspects of embodiments described generally describe time annotated transaction level modeling.

BACKGROUND

In computer networks, internetworking, communications, integrated circuits, etc., where there is a need to communicate information, there are interconnections established to facilitate the transfer of the information. Interconnects may provide the physical communication network between two agents such as agents of Intellectual Property (IP) blocks. When designing systems that comprise such IP blocks and interconnects, testing and simulation occurs prior to the fabrication of a System on a Chip (SoC) containing the IP blocks.

Before the SoC design can be manufactured, it should first be designed, modeled, and verified. SystemC, a modeling language and simulation environment, is an excellent choice for building a software simulation model of the SoC. Just as the physical hardware is designed by choosing IP blocks and then connecting them together with interfaces, the software simulation model is built from behavioral models of the IP blocks that are then connected together by channel models.

A behavioral model may be an encoded formal abstract definition of the hardware/IP block device being modeled. The behavioral model describes the hardware/IP block devices basic components, their properties, available operations, operation granularity, etc. The behavioral model allows designers to analyze intrinsic operation of a single component and/or the entire system while ignoring many implementation issues.

Software simulation models are built to provide high level models of a chip or system design. One form of higher level modeling is transaction level modeling, where data and commands may be sent from one module to another through function calls. Software simulation models may use burst transactions to increase the simulation speed. However, the cycle timing accuracy of this type of models can be much lower comparing to their corresponding physical hardware system. A burst transaction is the sending of a whole group of individual data words over an interconnect in response to a single request. The burst transaction modeling scheme for Open Core Protocol (OCP) communications modeling may be referred to as TL2 for "transaction level 2". The slower, one data word transmitted per request method of sending a request across an OCP channel is called TL1 for "transaction level 1". TL1 attempts to capture the cycle timing and ordering of the hardware connection being modeled.

A previous OCP TL2 software simulation model sent bursts through the channel without any explicit timing information for each data word. When a module received a burst transaction of, for example, 10 data words, the receiving module had no timing information to determine when each of the individual data words would have arrived. Thus, generally this previous OCP TL2 simulation model may not be used by an architect who wants the fast simulation turnaround time of such a high level simulation model of the system, but also demands high cycle timing accuracy from the simulation model (for instance, 75% or higher cycle timing accuracy when compared to the corresponding physical hardware).

SUMMARY OF THE INVENTION

Methods and apparatuses are described for time annotated transaction level modeling. An apparatus for explicit time annotated transaction level modeling includes an initiator module, a target module, and a communications channel with each being modeled as an executable behavioral model. The communications channel transports burst information between the initiator module and the target module. The communications channel has timing variable functions to store timing variables and derive timing information associated with each individual transfer within a burst transaction during a simulation.

A modeling tool for explicit time annotated transaction level modeling includes IP modules and a channel communications module. The IP modules are the IP sub-components of an electronic design system modeled as executable behavioral models. The channel communications module estimates timing points for each request and response transfer between sub-components in the electronic design system based on a burst transaction having an accurate time annotation for the start and arrival of each transfer in the burst transaction.

BRIEF DESCRIPTION OF THE DRAWINGS

The present invention is illustrated by way of example and not limitation in the figures of the accompanying drawings, in which like references indicate similar elements and in which:

FIG. 2B illustrates an embodiment of a block diagram of an issued request transaction having a timing field and a burst information;

DETAILED DESCRIPTION

Figure 1:
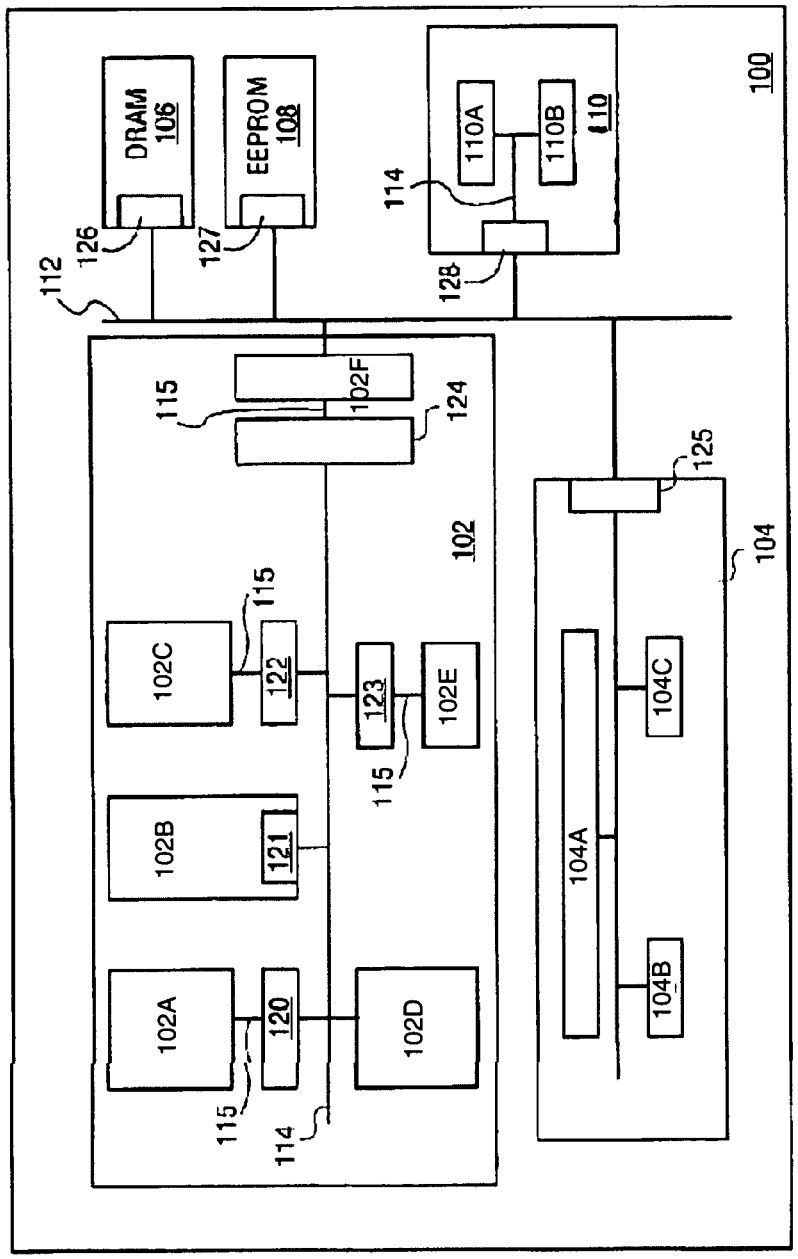
FIG. 1 illustrates an embodiment of a block diagram of a electronic design system.

In the following description, numerous specific details are set forth, such as examples of specific protocol commands, named components, connections, types of burst capabilities, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references such as a first set of timing variables, may be made. However, the specific numeric reference should not be interpreted as a literal sequential order but rather interpreted that the first set of timing variables is different than a second set of timing variables. Thus, the specific details set forth are merely exemplary. The specific details may be varied from and still be contemplated to be within the spirit and scope of the present invention.

A System on a Chip (SoC) may include multiple Intellectual Property (IP) blocks. An IP block may be a discrete wholly integrated functional block of logic that performs a particular function, such as a memory component, a wireless transmitter component, a Central Processing Unit (CPU), Digital Signal Processors, hardware accelerators such as Moving Pictures Experts Group video compression components, Direct Memory Access components, etc. for a SoC. Each IP block is capable of performing its function. A SoC may contain one or more interconnect cores that are responsible for connecting and allowing the other IP blocks to communicate with one another.

Before the SoC design can be manufactured, it should first be designed, modeled, and verified. Software simulation models are built from behavioral models of the IP blocks that are then connected together by communication channel models. Software simulation models, such as transaction models, are built to provide high level models of a chip or system design.

An example apparatus to provide transaction modeling includes an initiator module, a target module, and a communications channel with each being modeled as an executable behavioral model. The communications channel simulates transporting transactions carrying burst information between the initiator module and the target module. The communications channel has timing variable functions to store timing variables and derive timing information associated with each individual transfer within a burst transaction during a simulation.

A timing variable function may be a self-contained software routine that performs a task. Values may be passed to the function, and values may be returned. Or, the function may just perform the operation and not return a resulting value. The concept of a function within a program is that, once written, that function can be used over and over again without the programmer having to duplicate the same lines of code in the program each time that same processing is desired. Functions may be activated by placing a "function call" statement in the program. The function call often includes values (parameters) that are passed to the function. When called, the function performs the operation and returns control to the instruction following the call.

In another embodiment, a modeling tool for explicit time annotated transaction level modeling includes a first module and a channel communications module. The first module generates IP sub-components of an electronic design system modeled as executable behavioral models. The channel communications module estimates timing points for each request and response transfer between sub-components in the electronic design system based on a burst transaction having an accurate time annotation for transfers in the burst transaction. A start time and an arrival time may be derived for each transfer in the burst transaction based upon the time annotation.

FIG. 1 illustrates an embodiment of a block diagram of an electronic design implemented in physical hardware. Shared communications bus 112 connects sub-systems 102, 104, 106, 108, and 110. Sub-systems are typically functional blocks including an interface module for interfacing to a shared bus. Sub-systems may themselves include one or more functional blocks and may include an integrated or physically separate interface module. In one embodiment, the sub-systems connected by communications bus 112 are separate integrated circuit chips. In another embodiment, the sub-systems connected by communications bus 112 are IP cores on a SoC. The communications themselves may be communicated over a shared bus 112, communicated point to point, or a combination of both.

This example electronic design system may be modeled. This example electronic design system may have timing information associated with transfers between the Sub-systems that are determined during simulation tests. The annotated timing can be used in a chip model, which is made up of sub models of various types. The timing annotated channel model can be used to model the communications between one Intellectual Property (IP) block model and another IP block model, between one IP block model and a communications model such as a bus or interconnect, and between on communications model and another communication model.

In an embodiment, Sub-system 104 may be an application specific integrated circuit (ASIC), which is an integrated circuit designed to perform a particular function. Sub-system 106 is a dynamic random access memory (DRAM). Sub-system 108 is an erasable, programmable, read only memory (EPROM). Sub-system 110 can be a field programmable gate array (FPGA). Sub-system 102 can be a fully custom integrated circuit designed specifically to operate in system 100. Other embodiments may contain additional sub-systems of the same types as shown, or other types not shown. Other embodiments may also include fewer sub-systems than the sub-systems shown in system 100.

Integrated circuit 102 includes sub-systems 102A, 102B, 102C, 102D and 102E. ASIC 104 includes functional blocks 104A, 104B and 104C. FPGA 110 includes functional blocks 110A and 110B. A functional block is a particular block of logic that performs a particular function, such as memory storage area, on an integrated circuit, etc.

System 100 is an example of a system that may consist of one or more integrated circuits or functional IP cores on a single chip.

Shared communications bus 112, such as a system on a chip interconnect, provides a shared communications bus between sub-systems of system 100. Shared communications bus 114 provides a shared communications bus between sub-systems or functional blocks on a single integrated circuit.

Some of the functional blocks shown are connected to interface modules through which they send and receive signals to and from shared communications bus 112 or shared communications bus 114. Interconnect 115 is a local point-to-point interconnect for connecting interface modules to functional blocks.

Interface modules 120-127 are connected to various functional blocks as shown. In this embodiment, interface modules 120, 122, 123 and 124 are physically separated from their connected functional block (A, B, C, E and F, respectively). Interface modules 121, and 125-128 are essentially part of their respective functional blocks or sub-systems. Some functional blocks, such as 102D, do not require a dedicated interface module. The arrangement of sub-systems, functional blocks and interface modules is flexible and is determined by the system designer.

In one embodiment, there are four fundamental types of functional blocks. The four fundamental types are initiator, target, bridge, and snooping blocks. A typical target is a memory device. A typical initiator is a central processing unit (CPU). However, any block may be a target or an initiator for a given transaction. A typical bridge might be shared communications buses 112 and 114. Functional blocks all communicate with one another via shared communications bus 112 or shared communications bus 114 and the protocol of one embodiment. Initiator and target functional blocks may communicate to a shared communications bus through interface modules. An initiator functional block may communicate with a shared communications bus through an initiator interface module and a target functional block may communicate with a shared communications bus through a target interface module.

An initiator interface module issues and receives read and write requests to and from functional blocks other than the one with which it is associated. In one embodiment, an initiator interface module is typically connected to a CPU, a digital signal processing (DSP) core, or a direct memory access (DMA) engine.

Note, the interconnect shown in FIG. 1 illustrates a bus based interconnect. However, the interconnect may be implemented in many ways such as switched or routed networks.

In one embodiment, a computing system with a processor component executes instructions to simulate an initiator module, such as sub-system 102A, that generates a first set of timing variables. A target module, such as sub-system 102D, generates a second set of timing variables. A channel module, such as communications bus 114, transports transactions containing burst information for a plurality of individual transfers between the initiator module and the target module. The channel module may be modeled as an executable behavioral model and have a timing variable function to store timing variables and derive timing information associated with each individual transfer within a burst transaction during a simulation.

In another embodiment, the initiator module can be modeled to represent functional block 110A, the target module can be modeled to represent functional block 104A, and the channel module can be modeled to represent communications bus 112.

The channel module may contain a processing module to calculate when each transfer in the burst information started on the channel and the latency for each transfer crossing the channel based on the timing variables available from the channel module. The channel module can be represented by the communications bus 112 in addition to one or more functional blocks for storing timing variables.

The channel module may also be a point to point connection between an IP blocks such as connections 115 in FIG. 1. In this embodiment, the annotated timing variables may be used to closely estimate the timing of individual transfers between models of IP blocks even if the transfers were sent together in a burst at once. The annotated timing can be used whether the models on each end are electronic components, communications comments, or a mixture of the two.

Figure 2A:
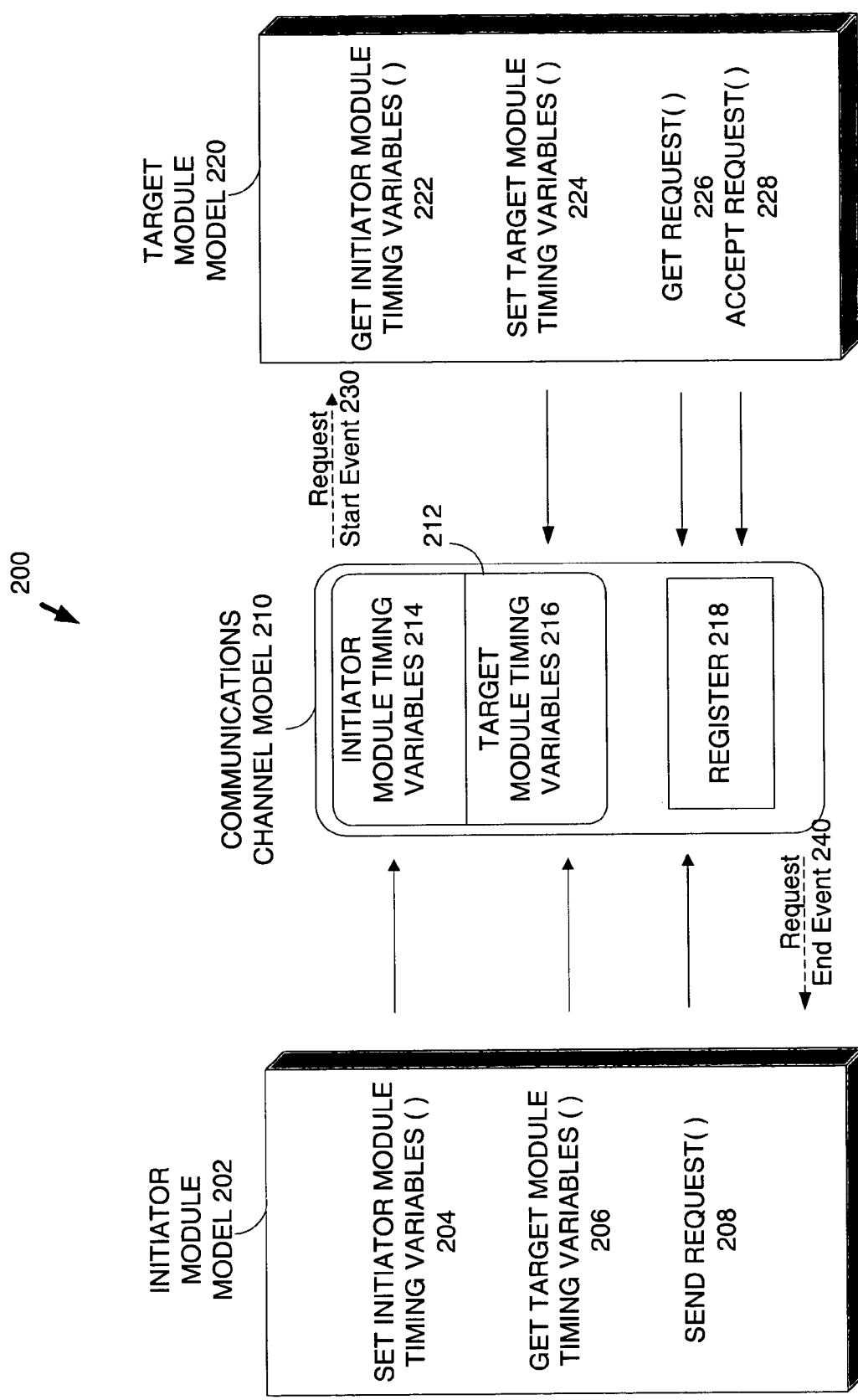
FIG. 2A illustrates an embodiment of a block diagram of an apparatus that provides time annotated transaction modeling.

FIG. 2A illustrates an embodiment of a block diagram of an apparatus that provides time annotated transaction modeling. The apparatus includes an initiator module model 202, a target module model 220, and a communications channel model 210. The initiator module model 202, target module model 220, and communications channel model 210 are each modeled as executable behavioral models. The executable behavioral model can be a transaction level model written in software language such as SystemC. Data and commands may be sent between modules using function calls.

FIG. 2B illustrates an embodiment of a block diagram of a request transaction, having a timing field and fields associated with a burst transaction. The transaction 250 includes a command field 260, a data field 270, a burst length field 274, an address field 280, and a timing field 290. The command field 260 may include the type of burst transaction, such as a write or read burst transaction, a burst pattern such as incrementing, streaming, etc, as well as the thread ID for the transaction. The data field 270 may include one or more data words to be written to the target module model 220 or read from the target module model 220. The burst length field 274 may include the length of the instruction 250. The address field 280 may include the various addresses, such as the source and destination address of the data words to be written to the target module model 220 or read from the target module model 220. The timing field 290 may include timing variables and derived timing information based on the timing variables. The transaction 250 sent by the initiator module model 202 may include timing variables generated by the initiator module model 202.

Figure 2C:
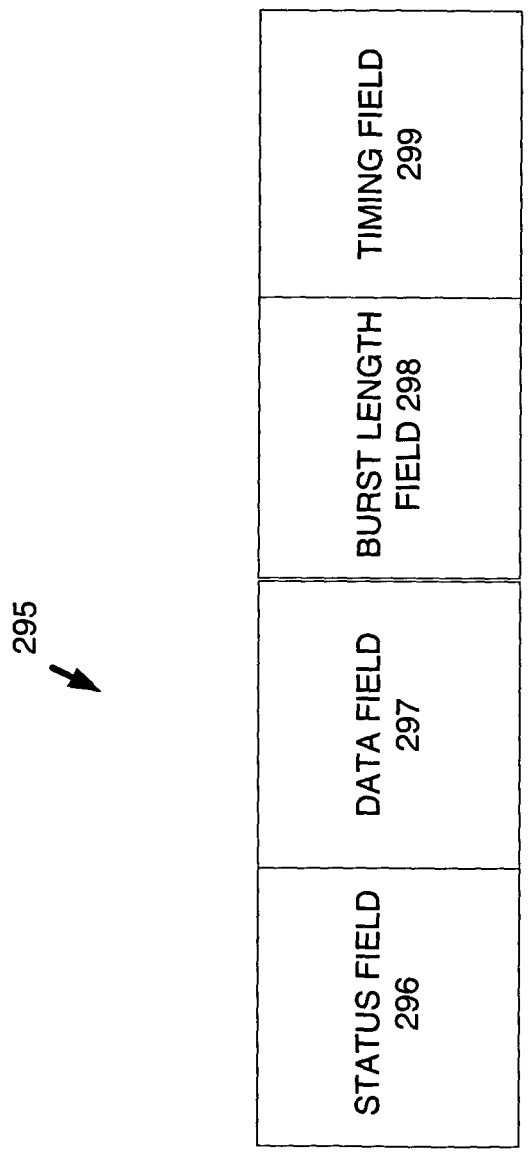
FIG. 2C illustrates an embodiment of a block diagram of an issued response transaction having a timing field and a burst information.

FIG. 2C illustrates an embodiment of a block diagram of a response transaction, having a timing field and fields associated with a burst transaction. The response transaction 295 includes a status field 296, a data field 297, a burst length field 298, and a timing field 299. The status field 296 may include the status of the response, such as whether an error occurred, if the corresponding request was successful, etc., as well as a thread ID for the response. The data field 297 may include one or more data words read from the target module model 220. The burst length field 298 may include the length of the response 295. The timing field 299 may include timing variables and derived timing information based on the timing variables. The transaction 295 sent by the target module model 220 may include timing variables generated by the target module model 220.

In one embodiment, the target module model 220 sends a transaction 295 to the communications channel model 210. The transaction 295 may include timing variables generated by the target module model 220.

The communications channel model 210 may examine the type of burst request generated by the initiator module model 202 and the modeled behavioral characteristics of the target module model 220. The behavioral models may send instructions with data fields for the target address, the initiator address, the type of burst transaction, the timing variables associated with that behavioral model, etc.

The communications channel model 210 between the initiator module model 202 and target module model 220 has a timing variable function 212 to store timing variables and derive timing information associated with each individual transfer within a burst transaction during a simulation.

The timing variable function 212 of the communications channel model 210 includes initiator module timing variables 214 and target module timing variables 216. The initiator module model 202 sends a function call, such as a set initiator module timing variables ( ) 204, to the communications channel model 210 which stores the initiator module timing variables: The target module model 220 sends a function call, such as a set target module model timing variables ( ) 224, to the communications channel model 210 which stores the target module timing variables. The communications channel model 210 can then derive timing information associated with each individual transfer within the burst transaction during a simulation based on timing variables received from the initiator module model 202 and the target module model 220.

In an embodiment, the target module model 220 may write its timing variables to the timing field of the transaction 295. Likewise, the initiator module model 202 may write its timing variables to the timing field of the transaction 250. Thus, the timing annotated TL2 channel model has timing information, overhead timing fields (290 and 299), stored in each transaction.

In another embodiment of the annotated timing, no timing fields 290 or 299 exist as part of the transaction. In contrast, the timing information is sent separately from the burst transaction. The timing information for the next (and each subsequent) transaction is set by direct function calls to the channel model. This setting of timing information by direct function calls may be easier to use in the case where the timing information does not change with every new transaction. This reduces the overhead involved, making the channel easier to use and also increases simulation performance.

Either way, the target module model 220 can access timing variables associated with the initiator module model 202 by sending a function call, such as a get initiator module model timing variables ( ) 222, to the communications channel model 210. The initiator module model 202 can send a function call, such as a get target module model timing variables ( ) 206, to the communications channel model 210 to access timing variables associated with the target module model 220.

The initiator module model 202 and target module model 220 can both access derived timing information associated with each individual transfer within the burst transaction during a simulation by sending a function call to the communications channel model 210. The initiator module model 202 and target module model 220 can each calculate timing points for each transfer received within the burst transaction based on timing variables stored and timing information derived in the timing variable function of the communications channel model 210.

In one embodiment, the initiator module model 202 calls a function, such as a send request ( ) 208, in the communications channel model 210 through a port that is connected to the communications channel model 210. The communications channel model 210 takes the request and triggers an event, request start event 230. The request start event 230 starts a process in the target module model 220 which then sends the function call, get request ( ) 226, to the communications channel model 210. At a possibly later time, the target module model 220 may send the function call, accept request ( ) 228 to the communications channel model 210. The communications channel model 210 then triggers an event, request end event 240, that the initiator module model 202 recognizes as signaling the end of the request. The request sent from initiator module model 202 to communications channel model 210 can be accessed by the target module model 220 via a register 218 or other storage device within the communications channel model 210. The channel model may also contain state variables stored in a hardware storage device such as a register 218, or a memory.

The apparatus 200 illustrates a time annotated transaction model that sends both burst and timing information to the communications channel model 210. In a transaction model, communication between modules is modeled using function calls. A transaction model is functionally accurate and may be cycle timing accurate or approximate. The communications channel model 210 can be a time annotated OCP TL2 channel. An OCP burst transaction includes the transporting of burst information across the OCP TL2 channel. Burst information includes request, data, and response transfers. A time annotated OCP TL2 burst transaction includes the transporting of burst and the setting of the timing information associated with each individual transfer within a burst transaction. As discussed, the OCP burst transaction may not contain a timing information field 290 or timing information field 299. Instead, the initiator module model 202 and the target module model 220 using separate function calls to the channel model set the timing information.

In one embodiment, the initiator module model 202 can be a master module model and the target module model 220 can be a slave module model. The initiator module model 202 can set the initiator timing variables for the burst transaction by calling a function in the channel model. The timing variables can be used to derive timing points for each individual transfer of the burst. The target module model 220 can set its timing variable fields in the channel model after it receives the burst transaction. These timing variables can be used to derive timing points for each individual transfer of the burst.

In one embodiment, the initiator module model 202 supplies timing variables in one function call associated with a number of requests and responses. The same timing variables may then be used repeatedly for all following burst requests. The target module model 220 also supplies timing variables in one function call associated with a number of requests and responses. The function calls between the initiator module model 202 and the target module model 220 simulate a communications protocol of the communications channel.

The initiator module model 202 and target module model 220 can each calculate timing points for each transfer received within a burst transaction based on timing variables stored and timing information derived in the timing variable function 212 of the communications channel model 210. This can lead to high cycle timing accuracy that had merely been achievable with the much slower TL1 channel while still keeping the large performance gain from sending whole bursts at once.

Accordingly, the time annotated transaction model may generate fast simulation times for burst transaction simulations with highly accurate timing information for each transfer in the burst transaction. In one embodiment, the target module model 220 sends two or more responses in a single function call. In another embodiment, the initiator module model 202 sends two or more requests in a single function call.

Burst transactions send a plurality of transfers as a group instead of one transfer at a time. Timing variables and derived timing information associated with all transfers in a burst transaction may be stored. The derived timing information, such as time annotations that each transfer in the time annotated burst transaction is, for example, 10 nanoseconds apart, and may be stored in the communications channel model 210. Overall, accurate timing information is generated for each transfer that makes up the high speed time annotated burst transaction. The time annotated transaction model may also incorporate this timing point technique into other transaction level models as well.

Each burst transaction may have a thread ID associated with it such as in the command field (260) or the status field (296) of the transaction. Each burst transaction may have timing variables, which are set to match the transaction and the thread ID associated with the transaction. Timing variable values may be different for each different transaction. Timing variables may be different for transactions with different thread IDs.

In one embodiment, the software used to facilitate the protocol and algorithms associated with the time annotated transaction modeling can be embodied onto a machine-readable medium. A machine-readable medium includes any mechanism that provides (e.g., stores and/or transports) information in a form readable by a machine (e.g., a computer). For example, a machine-readable medium includes read only memory (ROM); random access memory (RAM); magnetic disk storage media; optical storage media; flash memory devices; DVD's, EPROMs, EEPROMs, FLASH, magnetic or optical cards, or any type of media suitable for storing electronic instructions. The information representing the apparatuses and/or methods stored on the machine-readable medium may be used in the process of creating the apparatuses and/or methods described herein. For example, the information representing the apparatuses and/or methods may be contained in an Instance, soft instructions in an IP generator, or similar machine-readable medium storing this information.

Accordingly, a machine-readable storage medium having instructions stored thereon, which when executed by a machine, can cause the machine to generate an apparatus. The apparatus may at least include an initiator module, a target module a communications channel. The initiator module can be modeled as an executable behavioral model. The target module can be modeled as an executable behavioral model. The communications channel is configured to transport burst information between the initiator module and the target module. The communications channel can be modeled as an executable behavioral model and has timing variable functions to store timing variables and derive timing information associated with each individual transfer within a burst transaction during a simulation.

The machine readable storage medium storing these instructions may perform the time annotated transaction level modeling of the apparatus containing the initiator module, the target module, and the communications channel.

Also, a computing system, may at least include a processor component, a machine readable storage medium, an initiator module, a target module and a channel module. The processor component cooperates with the machine readable storage medium. The processor component executes instructions to simulate: the initiator module that generates a first set of timing variables; the target module that generates a second set of timing variables; and the channel module for transporting transactions that include burst information for a plurality of transfers between the initiator module and the target module. The channel module is configured to store the first and second set of timing variables. A processing module calculates when each transfer in the burst information started on the channel and a latency for each transfer crossing the channel module based on the first and second set of timing variables.

In one embodiment, a method to provide time annotated transaction level modeling includes simulating the transporting of burst information including a plurality of transfers between the initiator module model 202 and the target module model 220 via a channel. The method further includes maintaining a first set of timing variables associated with the initiator module model 202 and maintaining a second set of timing variables associated with the target module model 220.

The method may further include simulating the communications channel module model 210 for transporting burst information across the channel, and storing the first and second set of timing variables; and calculating when each transfer in the burst information started on the channel and the latency for each transfer crossing the channel based on the first and second set of timing variables.

The method may further include simulating a channel call sent from the initiator module model 202 to the communications channel module model 210 for transporting the first set of timing variables across the channel; and simulating a channel call sent from the target module model 220 to the communications channel module model 210 for transporting the second set of timing variables across the channel.

The following timing diagrams illustrate various implementations of time annotated transaction modeling.

Figure 3:
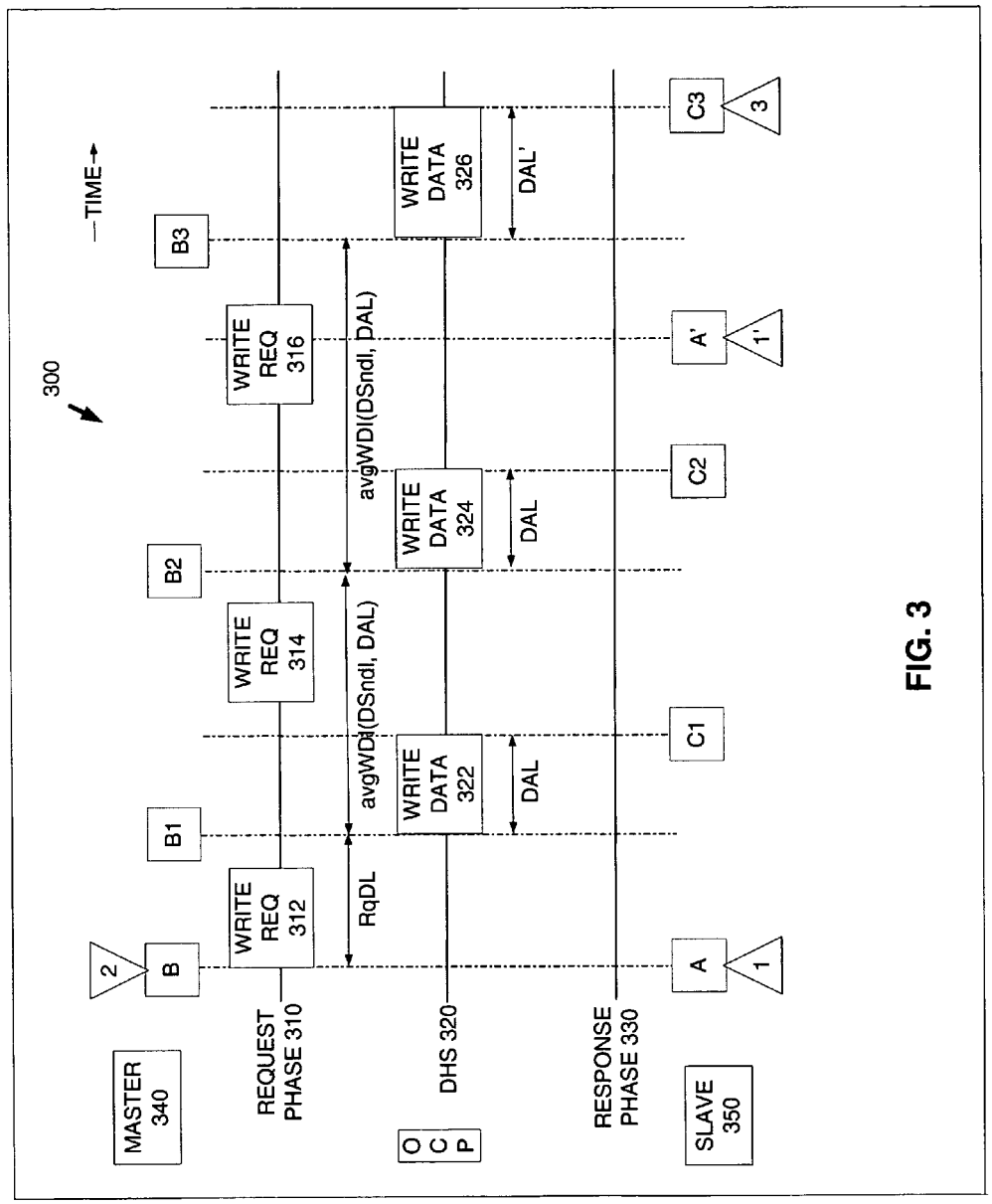
FIG. 3 illustrates an embodiment of a timing diagram for a time annotated OCP TL2 channel model with a multiple request multiple data (MRMD) posted write burst transaction with data handshake.

FIG. 3 illustrates an embodiment of a timing diagram for a time annotated OCP TL2 channel model with a multiple request multiple data (MRMD) posted write burst transaction with data handshake. The time annotated OCP TL2 channel model 300 (channel 300) transports a burst transaction between a master module model 340 (master 340) and a slave module model 350 (slave 350). Each model is an executable behavioral model. The executable behavioral model can be a transaction level model written in the SystemC language.

The channel 300 achieves a fast channel speed due to using the entire OCP burst transaction as the granularity of the model. The channel 300 stores timing variables and derives timing information that can be used to accurately estimate the timing of the individual OCP transfers that underlie each OCP burst transaction while maintaining the efficiency of sending an entire burst as a single command. The stored timing variables can include a first and second set of timing variables corresponding to the master 340 and slave 350, respectively. When a core model, such as master 340 or slave 350, receives an OCP burst transaction, that core model can use the timing variables and derived timing information to calculate the starting and ending times of each OCP transfer that makes up the burst. The master 340 can set the following timing variables: request data latency (RqDL), response accept latency (RpAL), request send interval (RqSndI) and data send interval (DSndI). The slave 350 can set the following timing variables: request accept latency (RqAL), write data accept latency (DAL), and response send interval (RpSndI).

The channel 300 derives timing information based on the timing variables set by the master 340 and slave 350. The derived timing information includes an estimated average write data interval (avgWDI), an estimated average read request interval (avgRRqI), an estimated average read data interval (avgRDI) and an estimated average write response interval (avgWRpI). Additional derived timing information includes the start time of each individual request, the start time of each individual data handshake transfer, and the total duration of the burst.

In order to optimize speed and efficiency, the channel 300 can be un-clocked with the timing determined by the master 340 and the slave 350, which send function calls to the channel 300. The channel 300 is active when the master 340 or slave 350 has called one of its functions.

In FIG. 3, activities for a request phase 310, a data handshake phase (DHS) 320, and a response phase 330 within a burst transaction are represented horizontally with simulation time increasing from left to right. The channel 300 transports burst information such as requests on the request phase 310, data on the DHS 320, and responses on the response phase 330 between the master 340 and slave 350. Each dashed vertical line indicates a timing point, actual or estimated, that occurs within a burst transaction. A timing point usually represents either the beginning or end of an OCP phase activity inside a burst transaction. The master 340 and the slave 350 use the timing points to improve timing accuracy. The alphanumeric order among letters shown inside dashed boxes attached to the same timing point line indicates which box occurs first. The number inside a dashed box, if any, indicates the transfer count. Latency between two interesting timing points is shown by a horizontal, double arrow line segment tagged with a fixed latency or a latency estimation function.

Dashed box A represents the last transfer timing point where a slave can provide backpressure information to the channel 300 to prevent a request. Dashed box B is the starting point of a write or read request. Dashed boxes B1, B2, and B3 are the starting points of write data blocks in FIG. 3. Dashed boxes C1, C2, and C3 are the ending points of write data blocks in FIG. 3.

Each triangle in FIG. 3 represents a function call that may need to be issued by the master 340 or slave 350 to the channel 300. Triangle 1 is the last time that the slave 350 can set the slave timing variables on the channel 300 for the next burst transaction. The slave 350 can modify the slave's timing variables at triangle 1' if mid burst backpressure is allowed. In this case, DAL was changed to DAL'. Triangle 2 is the start time of the TL2 burst request on the channel 300. Triangle 3 is the end of the burst transaction.

Note that the times when these function calls are made to the channel 300 are associated with actual simulation times given by the operation of the simulation. The other timing points are then estimated using both the actual timing points from the function calls and the timing variables passed to the channel 300.

In FIG. 3, time B is the last time for the master 340 to set the master's timing variables on the channel for the upcoming burst transaction. At time B, the master 340 calls a function to send the write burst over the channel 300. The master 340 sends all of the information for the write burst at this time, including the command field, a data array field, a burst length field, an address field, and other write burst transaction information. The burst transaction ends at timing point C3 with write data 326 being received by the slave 350. This timing point C3 is calculated from timing variables set by the master 340 and the slave 350 as well as by the burst length of the write transaction function call from the master 340 at triangle 2. The slave 350 accepts the burst request at triangle 3 but does not send an acknowledgement response to the master 340 in this burst transaction, which is a posted write burst.

The start time of the first data block, write data 322, can be determined from the start of burst transaction, time B, and from the request data latency (RqDL) timing variable of the master 340. RqDL is the interval in clock cycles between the time when the master 340 places the request on the channel 300 and the time that the master 340 places the corresponding data block on the channel 300. When the slave 350 receives the write burst request with the timing variable RqDL, the slave 350 knows the start time of the first write request 312 of the burst transaction and can compute the start time of the first data block as:

$$B1 = B + RqDL.$$

The average time between data block "i" and "i+1" of a burst, the average write data interval (avgWDI), can be determined by two factors: how fast the master 340 can send data down the channel 300 (DSndR) and how long the slave 350 waits to accept the data (DAL). Since the master 340 can not send a new data block until the slave 350 accepts the previous data block, both the master 340 and slave 350 determine the avgWDI.

$$avgWDI = \max(DSndI, DAL)$$

DSndR is defined to be the data arrival rate at which the master 340 sends data down the channel 300 if the slave were to instantly accept all data. The data send interval (DSndI) is 1/DSndR. DSndI is the interval between data blocks if the master 340 were connected to a fast slave 350. If the master 340 can send data over the channel 300 every single clock cycle, then the DSndI would be 1. If the master 340 can merely send data every other clock cycle, then the DSndI would be 2. The DAL, data accept latency, is the number of clock cycles the slave 350 will take to accept each data block, such as write data 322. The maximum interval of either DSndI or DAL is the limiting factor that determines the avgWDI. DAL' corresponding to write data 326 is a larger interval (more clock cycles) compared to DAL which corresponds to write data 322 and write data 324.

If the slave 350 runs at a constant rate, then the DAL and other slave timing variables can be left unchanged during the duration of the burst transaction. Optionally, the slave 350 can be configured to update the timing information to the channel 300. For example, during the burst, slave timing information can be provided at timing point A' by the slave 350. Mid burst timing information is treated as auxiliary information that is optional.

The end time of the OCP write burst occurs at timing point C3 when the slave 350 has accepted the burst transaction. After the slave 350 determines this timing point C3, the channel 300 is then free to start a new burst. The slave 350 should accept the OCP TL2 burst transaction even if the slave command accept or slave data accept signal is not part of the OCP channel.

Figure 4:
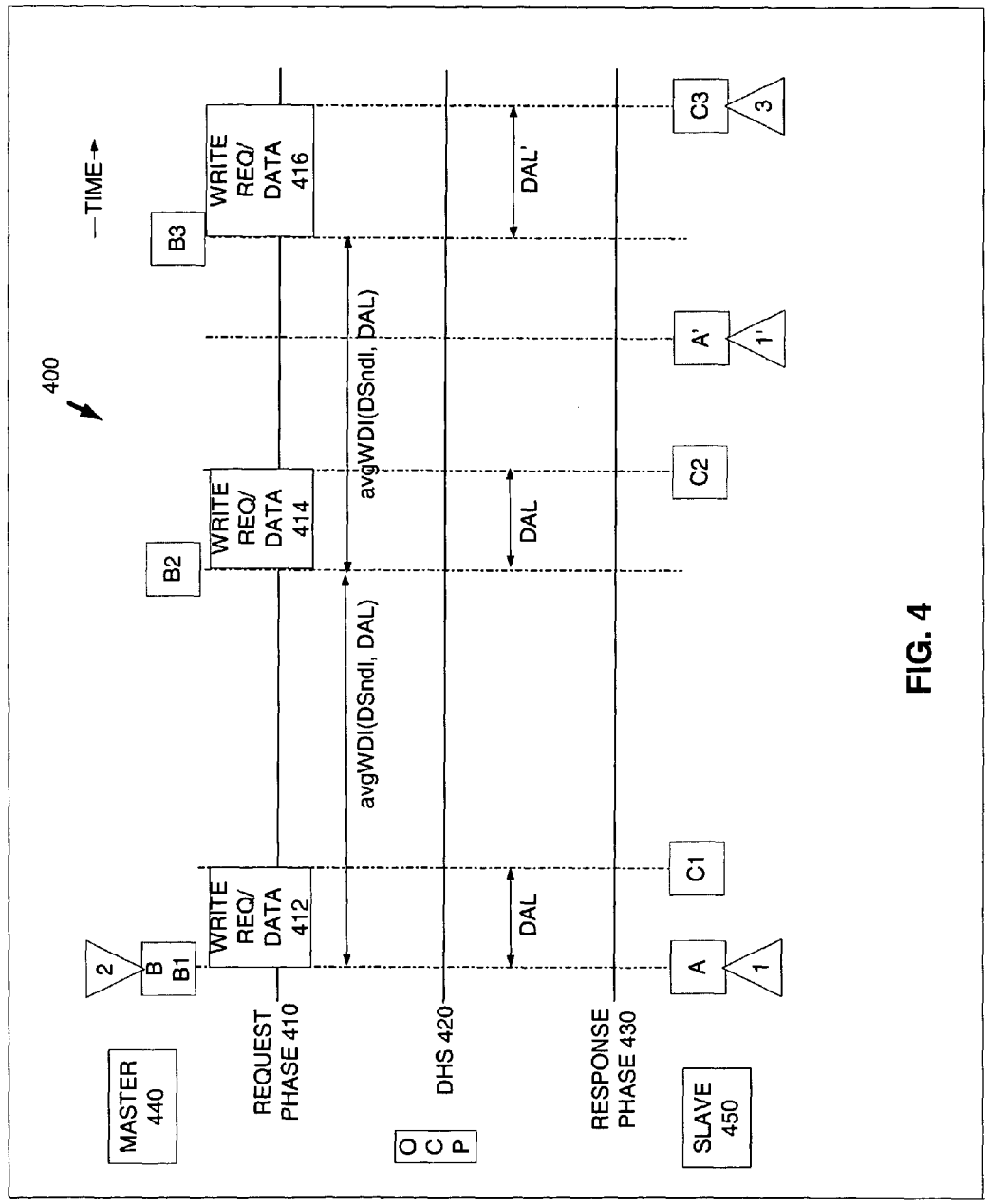
FIG. 4 illustrates an embodiment of a timing diagram for a time annotated OCP TL2 channel model with a multiple request multiple data (MRMD) posted write burst transaction with no data handshake.

FIG. 4 illustrates an embodiment of a timing diagram for a time annotated OCP TL2 channel model with a multiple request multiple data (MRMD) posted write burst transaction with no data handshake. The time annotated OCP TL2 channel model 400 (channel 400) transports burst information of the burst transaction between a master module model 440 (master 440) and a slave module model 450 (slave 450).

The timing diagram of FIG. 4 is similar to FIG. 3, except in FIG. 4, the DHS 420 is turned off. In an OCP channel without data handshake, each write request and write data block are sent together. Timing points B and B1 merge as RqDL equals zero for a channel with no data handshake. Write/req data 412 in FIG. 4 represents the same information as the combination of write req 312 and write data 322 in FIG. 3.

In FIG. 4, the burst transaction request starts at triangle 2 with the master 440 setting the master timing variables for the upcoming transaction. If the timing variables are the same as for the previous transaction, this step is optional. The master 440 may then call a function at triangle 2 to start the write burst request on the channel. The burst write transaction request may include a command field, a data array field, a burst length field, an address field, and other OCP transaction information. The burst write transaction ends at timing point C3 when the slave 450 accepts the burst transaction. The slave 450 does not send a response to the master 440 in this burst transaction.

The channel 400 stores timing variables set by the master 440 and the slave 450. The channel 400 provides timing helper functions that may be used to calculate derived timing information commonly needed by the master 440 and the slave 450. Approximate timing points for each OCP transfer (e.g., request, data, and response transfers) can be calculated based on the timing variables stored in the channel 400 and the derived timing information provided by the timing helper functions.

Figure 5:
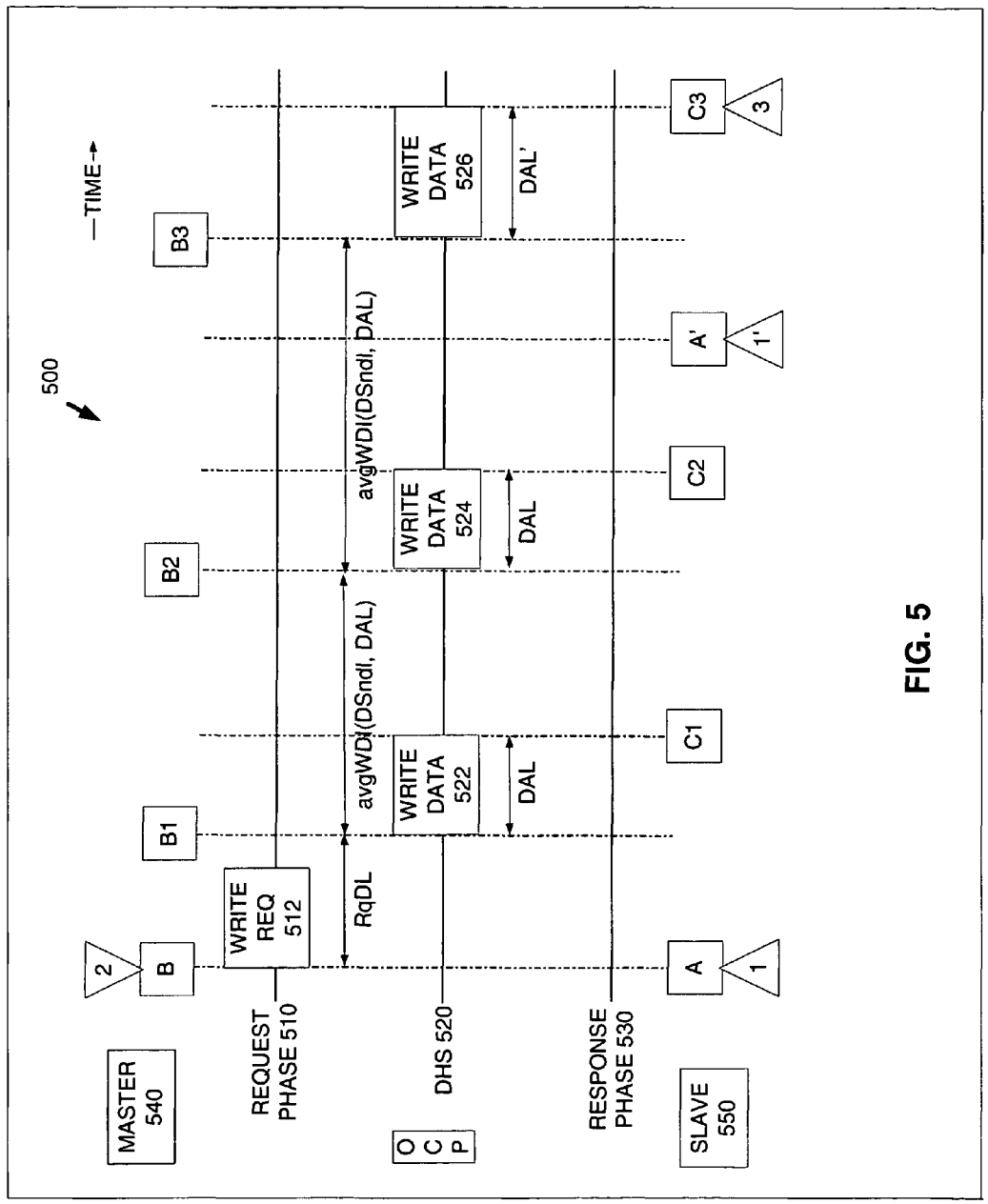
FIG. 5 illustrates an embodiment of a timing diagram for a time annotated OCP TL2 channel model with a single request multiple data (SRMD) posted write burst transaction.

FIG. 5 illustrates an embodiment of a timing diagram for a time annotated OCP TL2 channel model with a single request multiple data (SRMD) posted write burst transaction. The time annotated OCP TL2 channel model 500 (channel 500) transports burst information of the burst transaction between a master module model 540 (master 540) and a slave module model 550 (slave 550).

The timing diagram of FIG. 5 is similar to FIG. 3, except in FIG. 5, a single write request, write req 512, is sent from the master 540 to the channel 500. In FIG. 3, multiple write requests are sent each corresponding to one write data block. In FIG. 5, a single write request corresponds to all of the write data blocks of the burst.

In FIG. 5, the master 540 sets the master timing variables for the burst before sending the burst at triangle 2. The burst transaction starts at triangle 2 with the master 540 sending the write burst transaction to the channel 500. The write burst request may include a command field, a data array field, a burst length field, an address field, and other OCP fields. The channel 500 derives the timing information from the master and slave timing variables and from the length of the burst. The burst transaction ends at timing point C3, triangle 3, when the slave 550 accepts the burst write request. Because this is a posted write, the slave 550 does not send an acknowledgement response to the master 540 in this burst transaction.

The channel 500 stores timing variables set by the master 540 and the slave 550. The channel 500 provides timing helper functions that calculate derived timing information commonly needed by the master 540 and the slave 550. Approximate timing points for each OCP transfer (e.g., request, data, and response transfers) can be calculated based on the timing variables stored in the channel 500 and the derived timing information provided by the timing helper functions even though the entire burst transaction was sent with a single function call. Large arrays of data can be quickly written within a single burst transaction while maintaining accurate timing points.

Figure 6:
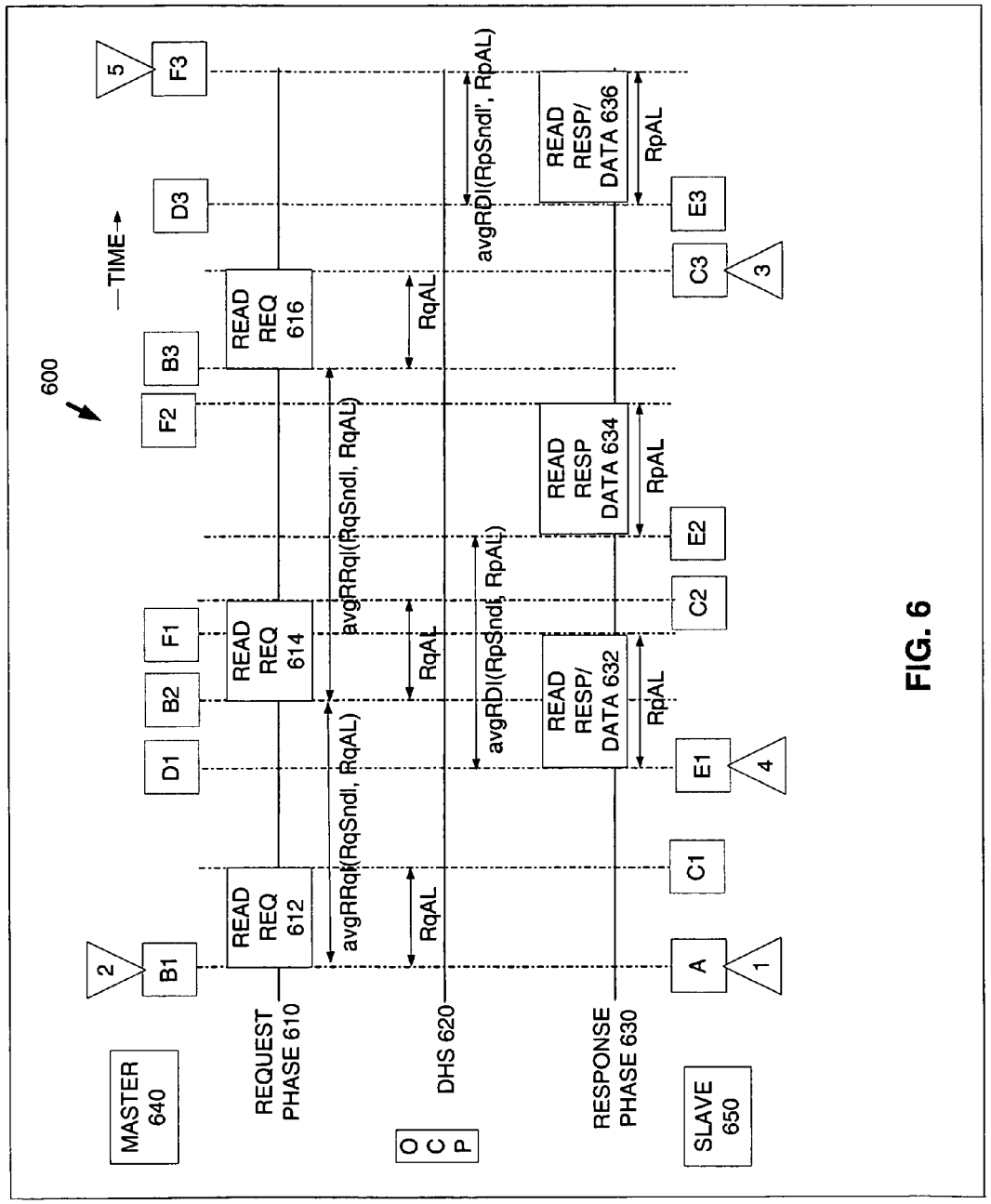
FIG. 6 illustrates an embodiment of a timing diagram for a time annotated OCP TL2 channel model with a multiple request multiple data (MRMD) read burst transaction.

FIG. 6 illustrates an embodiment of a timing diagram for a timing annotated OCP TL2 channel model with a multiple request multiple data (MRMD) read burst transaction. The time annotated OCP TL2 channel model 600 (channel 600) transports burst information of the burst transaction between a master module model 640 (master 640) and a slave module model 650 (slave 650).

A read burst is modeled using a read burst, request-side transaction and a read burst, response-side transaction in parallel. Thus, a read burst's response-side transaction can be overlapped with another read burst's request-side transaction, in terms of simulation timing.

A read burst has similar timing points as previously described for a write burst with a few exceptions. A read burst has no request-side data block delivery. A read request burst from the master 640 will cause a corresponding read response burst with response data from the slave 650. A read burst has new timing points including triangles 4 and 5 as well as dashed boxes D, E, and F.

The master 640 may call a function in the channel 600 to set the master timing variables for the read transaction. The master timing variables are related to how quickly the master 640 can send the read request burst and how quickly the master 640 can process and accept a response burst from the slave. At triangle 2, the master 640 calls a function to put the read burst request on the channel 600. At triangle 3, the slave 650 accepts the read burst request.

At triangle 4 the slave 650 may call a function to set the slave timing variables on the channel. This could be necessary if the timing variables for the response had changed since the slave 650 sent the last response burst. At triangle 4 the slave 650 calls a function in the channel 600 to start the response burst 630 on the channel. The response burst may contain fields for the status of the response, an array of the response data, the length of the response burst, and other OCP fields. At triangle 5 the master 640 accepts the response burst 630.

Dashed boxes B1, B2, and B3 represent the timing points for the start of each of the read requests which make up the read burst 610. Dashed boxes C1, C2, and C3 are the timing points of the end of each of the read requests which make up read burst 610. Dashed boxes E1, E2, and E3 represent the timing points of the start of each of the read response data words which make up the response burst 630. Dashed boxes F1, F2, and F3 are the timing points marking the ending points of an OCP response data words which make up the read response burst 630.

A read burst also has new timing variables and derived timing information including request send rate (RqSndR), request accept latency (RqAL), and average read request interval (avgRRqI). The average time between read request "i" and "i+1" of a read burst, the average read request interval (avgRRqI), can be determined by two factors: how fast the master 640 can send requests down the channel 600 (RSndR) and how long the slave 650 waits to accept the request (RqAL).

$$avgRRqI = \max(RqSndI, RqAL)$$

The request send interval (RqSndI) is 1/RqSndR. RqSndI is the interval between data requests if the master 640 were connected to a fast slave 650 which could instantly accept all requests. If the master 640 can send requests over the channel 600 every single clock cycle, then the RqSndI would be 1. If the master 640 can merely send requests merely every other clock cycle, then the RqSndI would be 2. The RqAL, data accept interval, is the number of clock cycles the slave 650 will take to accept each request. The maximum interval of either RqSndI or RqAL is the limiting factor that determines the avgRRqI.

If the slave 650 does not need to use backpressure to delay acceptance of data blocks, the RqAL is set to 1. The same mechanism used by the write burst is used on the request-side of a read burst in order to provide the backpressure timing information with RqAL replacing DAL.

Read requests and read data responses are processed independently on different paths as illustrated in FIG. 6. Thus, the master 640 can send a size 3 read burst requesting three data words and the slave 650 could respond with two chopped responses of size 2 and size 1.

The timing point E1 is the time of the first response data, read resp/data 632, sent over the OCP connection. There can be many read bursts for returning response data.

The average time between read response data "i" and "i+1" of a read burst, the average read data interval (avgRDI), can be determined by two factors: how fast the slave 650 can send response data blocks down the channel (RpSndI) and how long the master 640 waits to accept the response data block (RpAL).

$$avgRDI = \max(RpSndI, RpAL)$$

RpSndI is the number of clock cycles between response data blocks if the master 640 were to instantly accept all responses. If the slave 650 can send a new response data block over the channel every single clock cycle, then the RpSndI would be 1. If the slave 650 can merely send a new response data block every other clock cycle, then the RpSndI would be 2. The RpAL, response accept latency, is the number of clock cycles the master 640 will take to accept a response. The maximum interval of either RpSndI or RpAL is the limiting factor that determines the avgRDI. RpSndI' corresponding to read resp/data 636 is a shorter interval (less clock cycles) compared to RpSndI which corresponds to read resp/data 632.

If the master 640 does not need to use backpressure to delay acceptance of response data blocks, the RpAL is set to 1. The master 640 can be configured to update timing information to the slave 650. The master 640 can set its response timing variables before the response is started at time D1. Optionally, the master may change its timing values mid burst. In FIG. 6 such a mid burst timing variable change might be done at time D3. It may also optionally be set at other times during the burst.

In FIG. 6, the burst transaction starts at timing point B1 with the master 640 sending read req burst to the channel 600. The read req burst may include a command field, a burst length field, an address field, and other OCP fields. The slave 650 sends the read resp/data burst to the channel 600 at timing point E1 in response to the read req burst sent at timing point B1. The Read resp/data burst may include a response status field, a data array field, a burst length field, and other OCP response fields. The response burst transaction ends at timing point F3 with read resp/data burst being accepted by the master 640. The master 640 can send a burst read request to the slave 650 via the channel 600 in a single function call, for example, triangle 2. The slave 650 can send a burst read response data block to the master 640 via the channel 600 in a single function call, for example, triangle 4 in this burst transaction.

The channel 600 stores timing variables set by the master 640 and slave 650. The channel 600 provides timing helper functions that calculate derived timing information commonly needed by the master 640 and slave 650. Approximate timing points for each OCP transfer (e.g., request, data, and response transfers) can be calculated based on the timing variables stored in the channel 600 and the derived timing information provided by the timing helper functions.

Figure 7:
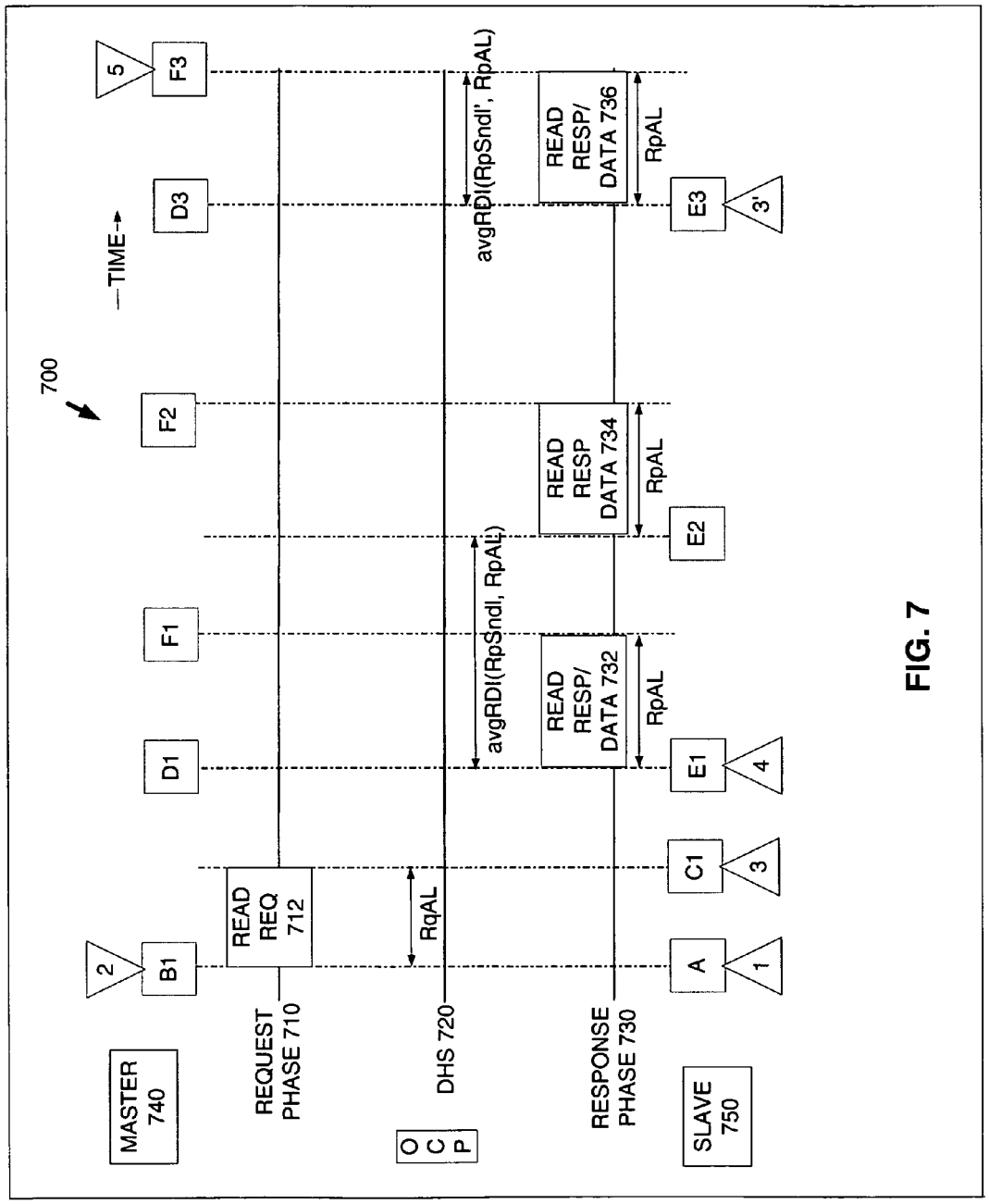
FIG. 7 illustrates an embodiment of a timing diagram for a time annotated OCP TL2 channel model with a single request multiple data (SRMD) read burst transaction.

FIG. 7 illustrates an embodiment of a timing diagram for a time annotated OCP TL2 channel model with a single request multiple data (SRMD) read burst transaction. The time annotated OCP TL2 channel model 700 (channel 700) transports burst information of the burst transaction between a master module model 740 (master 740) and a slave module model 750 (slave 750).

The timing diagram of FIG. 7 is similar to FIG. 6, except in FIG. 7, the read burst transaction is a single read request, read req 712, sent from the master 740 to the channel 700. In FIG. 6, multiple read response data blocks are sent in response to the read request. In FIG. 7, the single read request triggers the response of multiple read response data blocks.

In FIG. 7, the master 740 may set the master timing variables in the channel 700 for the read burst transaction at or before triangle 2. The read burst transaction starts at timing point B1 with the master 740 sending the read request burst transaction to the channel 700. The read request burst may include a command field, a burst length field, an address field, and additional OCP fields. The read request burst ends when the slave 750 accepts the read request burst. In FIG. 7 for example this occurs at triangle 3. The slave 750 can set the slave timing variables in the channel 700 for the response before it sends the burst response. In FIG. 7, this would be any time before or at triangle 4. The slave 750 sends the response burst transaction to the master 740 via the channel 700 in a single function call, for example, at triangle 4. The read burst response may include a response status field, a data array field, a burst length field, and other OCP fields. The response burst transaction ends at timing point F3 when the master 740 accepts the response burst with a function call to the channel 700 at triangle 5.

The channel 700 stores timing variables set by the master 740 and slave 750. The channel 700 provides timing helper functions that calculate derived timing information commonly needed by the master 740 and slave 750. Approximate timing points for each OCP transfer (e.g., request, data, and response transfers such as read req 712, read resp/data 732 and read resp/data 734) can be calculated based on the timing variables stored in the channel 700 and the derived timing information provided by the timing helper functions even though the read request and read response were sent as single burst transactions. Large arrays of data can be quickly accessed and read within a single burst transaction while maintaining accurate timing information.

Figure 8:
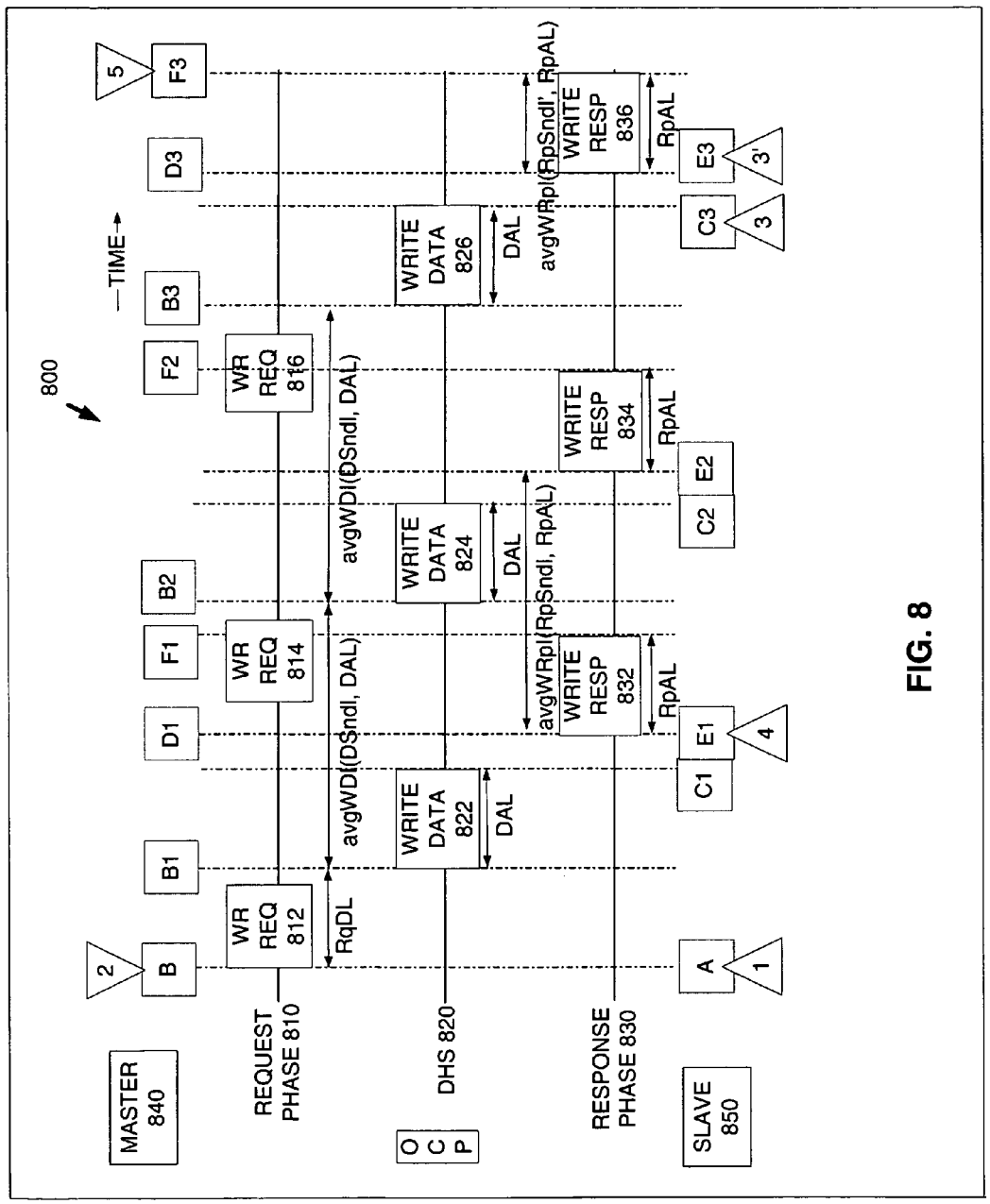
FIG. 8 illustrates an embodiment of a timing diagram for a time annotated OCP TL2 channel model with a multiple request multiple data (MRMD) non-posted write burst transaction with data handshake.

FIG. 8 illustrates an embodiment of a timing diagram for a time annotated OCP TL2 channel model with a multiple request multiple data (MRMD) non-posted write burst with data handshake on for a single write burst transaction. The time annotated OCP TL2 channel model 800 (channel 800) transports burst information of the write burst transaction between a master module model 840 (master 840) and a slave module model 850 (slave 850).

The timing diagram of FIG. 8 is similar to FIG. 3, except in FIG. 8 with a non-posted write burst, the slave 850 sends an acknowledgement response to the master 840 via the channel 800. In FIG. 3, the slave 350 does not send an acknowledgement response to the master 340 via the channel 300.

On the request side of the burst transaction, timing points and variables described in FIG. 3 with the posted write burst apply to FIG. 8. On the response side, FIG. 8 is similar to the timing points and variables in FIG. 6, except no data blocks are delivered and the avgRDI used for the read burst in FIG. 6 is replaced by the average write response interval (avgWRpI) in FIG. 8.

The average time between write response "i" and "i+1" of a write burst, the average write response interval, (avgWRpI), can be determined by two factors: how fast the slave 850 can return a write response (RpSndI) and how long the master 840 waits to accept the write response (RpAL).

$$avgWRpI=\max(RpSndI,RpAL)$$

RpSndI is the number of clock cycles between write responses if the master 840 were to instantly accept all responses. If the slave 850 can send a new write response over the channel 800 every single clock cycle, then the RpSndI would be 1. If the slave 850 can merely send a new write response every other clock cycle, then the RpSndI would be 2. The RpAL, response accept latency, is the number of clock cycles the master 840 will take to accept a response. The maximum interval of either RpSndI or RpAL is the limiting factor that determines the avgWRpI. RpSndI' corresponding to write resp 836 is a shorter interval (less clock cycles) compared to RpSndI which corresponds to write resp 832.

In FIG. 8, the burst transaction starts at timing point B with the master 840 sending a write burst request transaction to the channel 800. The write burst transaction may include a command field, a data field, a burst length field, an address field, and other OCP fields. The master 840 may set or change the master timing variables on the channel 800 by calling a function in the channel 800. The write burst request transaction ends at timing point C3 when the slave 850 accepts the write burst request transaction by calling at function in the channel 800 at triangle 3. In FIG. 8, the slave 850 sends an acknowledgement burst response to the master 840 through the channel 800 by calling at function in the channel 800 at triangle 4. This sets timing point E1, the start of the first acknowledgement response, write resp 832. The slave 850 may also set or change the slave timing variables at or before sending the response burst transaction at triangle 4. The response burst transaction ends at timing point F3. This time when the master 840 accepts the response burst transaction with a function call to the channel 800 at timing triangle 5. The timing point F3 is the time of the end of the last response acknowledgement transfer, write resp 836 in FIG. 8. The master 840 can send multiple write requests and write data blocks to the slave 850 via the channel 800 in a single function call, for example, triangle 2. The slave 850 can send multiple write responses to the master 840 via the channel 800 in a single function call, for example, triangle 4.

The channel 800 stores timing variables set by the master 840 and slave 850. The channel 800 provides timing helper functions that calculate derived timing information commonly needed by the master 840 and slave 850. Approximate timing points for each OCP transfer (e.g., request, data, and response transfers) can be calculated based on the timing variables stored in the channel 800 and the derived timing information provided by the timing helper functions.

Figure 9:
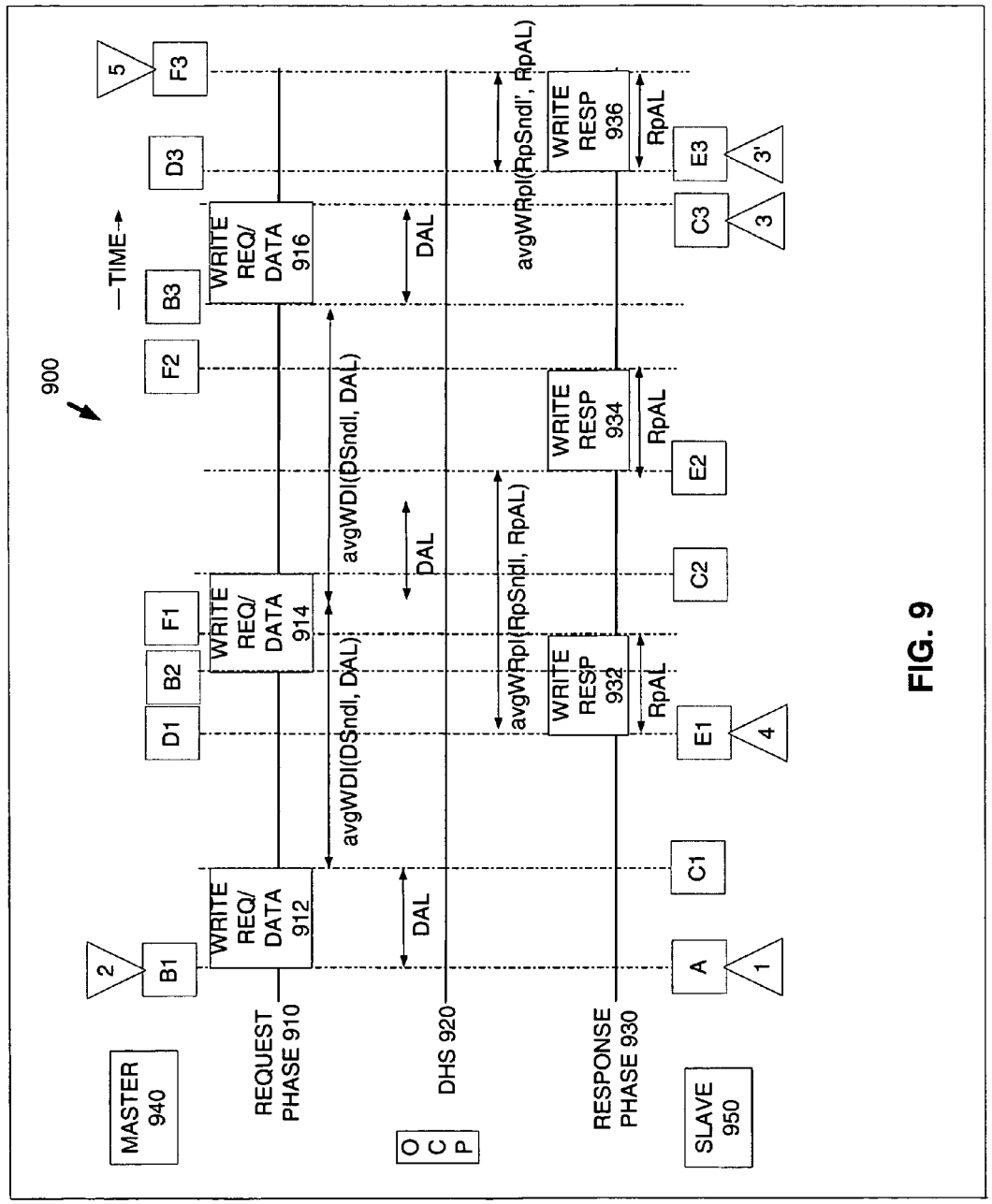
FIG. 9 illustrates an embodiment of a timing diagram for a time annotated OCP TL2 channel model with a multiple request multiple data (MRMD) non-posted write burst transaction with no data handshake.

FIG. 9 illustrates an embodiment of a timing diagram for a time annotated OCP TL2 channel model with a multiple request multiple data (MRMD) non-posted write burst transaction with no data handshake. The time annotated OCP TL2 channel model 900 (channel 900) transports burst information of the burst transaction between a master module model 940 (master 940) and a slave module model 950 (slave 950).

The timing diagram of FIG. 9 is similar to FIG. 8, except in FIG. 9, the data handshake, DHS 920, is turned off. Each write request and write data block are sent together by the master 940 as illustrated in FIG. 9. Timing points B and B1 merge because RqDL equals zero. Write/req data 912 in FIG. 9 represents the same information as write req 812 and write data 822 in FIG. 8.

In FIG. 9, the write request burst transaction starts at timing point B1 with the master 940 sending a write request burst transaction to the channel 900 by calling a function at triangle 2. The write request burst transaction may include a command field, a data field, a burst length field, an address field, and other OCP fields. The timing point B1 marks the beginning of the first write request in the burst, write req/data 912. The master 940 may also call a function in the channel 900 to set the master timing variables in the channel 900. The write request burst transaction ends at timing point C3 when the slave 950 accepts the write burst request with a function call to the channel 900 at triangle 3. The timing point C3 marks the end of the last write request in the burst, write req/dat 916. The slave 950 sends a burst response to the write request by calling a function in the channel 900 at triangle 4. The response burst transaction may include a response status field, a burst length field, and other OCP fields. The start of the response burst transaction is timing point E1, which is the start of the first response transfer, write resp 932. The slave 950 may also set slave timing variables with a call to the channel 900. The master 940 accepts the response burst transaction with a call to the channel at triangle 5. This is timing point F3 in FIG. 9, which is the end of the last write response transfer, write resp 936, being received by the master 940 from the slave 950. The master 940 can send multiple write request and data blocks to the slave 950 via the channel 900 in a single function call, for example, triangle 2. The slave 950 can send multiple write responses to the master 950 via the channel 900 in a single function call, for example, triangle 4.

The channel 900 stores timing variables set by the master 940 and slave 950. The channel 900 provides timing helper functions that calculate derived timing information commonly needed by the master 940 and slave 950. Approximate timing points for each OCP transfer (e.g., request, data, and response transfers) can be calculated based on the timing variables stored in the channel 900 and the derived timing information provided by the timing helper functions.

Figure 10:
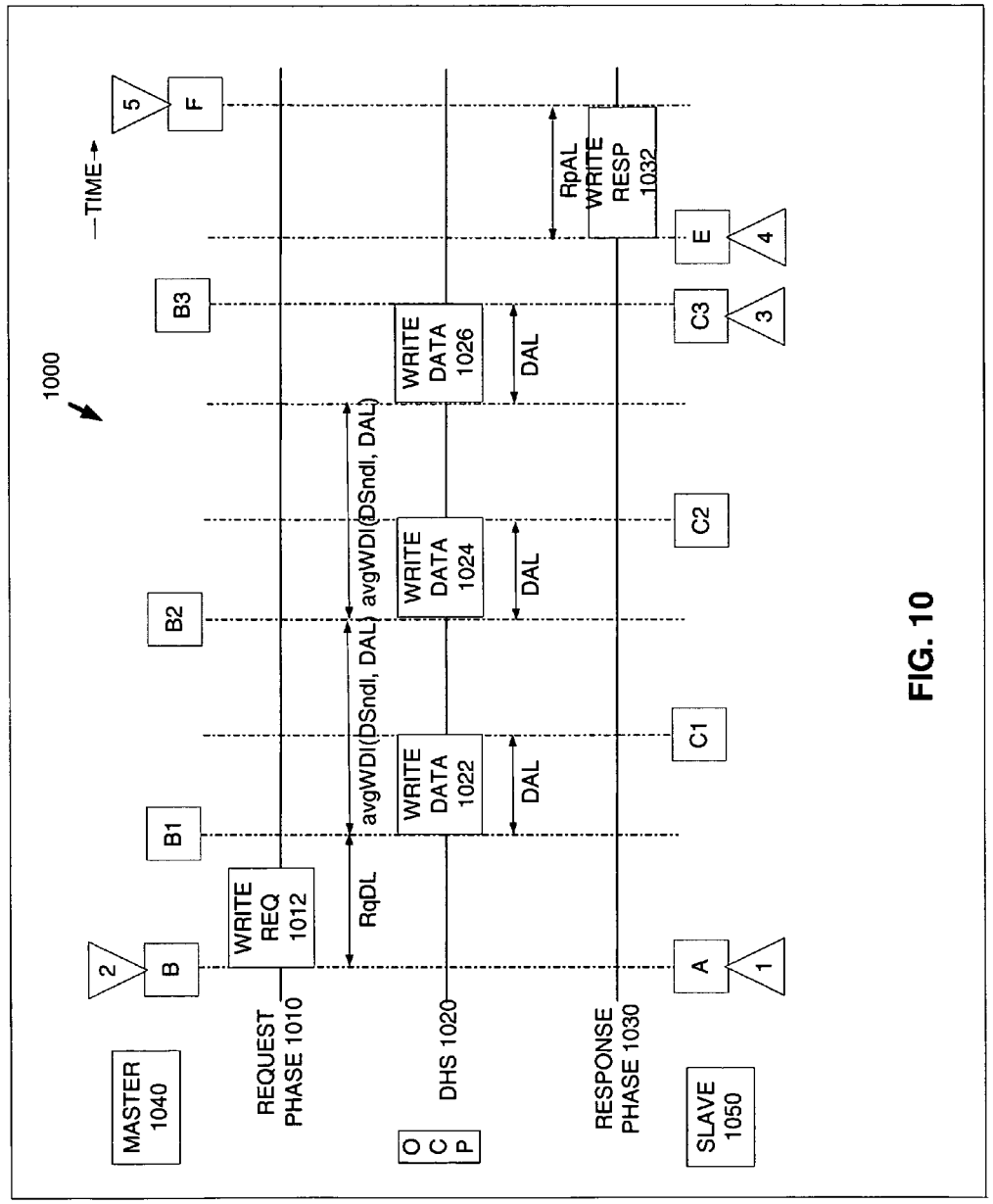
FIG. 10 illustrates an embodiment of a timing diagram for a time annotated OCP TL2 channel model with a single request multiple data (SRMD) non-posted write burst transaction.

FIG. 10 illustrates an embodiment of a timing diagram for a time annotated OCP TL2 channel model with a single request multiple data (MRMD) non-posted write burst transaction with data handshake. The time annotated OCP TL2 channel model 1000 (channel 1000) transports burst information of the burst transaction between a master module model 1040 (master 1040) and a slave module model 1050 (slave 1050).

The timing diagram of FIG. 10 is similar to FIG. 8, except in FIG. 10, the master 1040 sends a single write request transfer to the slave 1050 and the master 1040 receives a single write response transfer from the slave 1050. In FIG. 8, the master 840 sends multiple write requests to the slave 850 and the master 840 receives multiple write responses from the slave 850.

In FIG. 10, the burst transaction starts at timing point B with the master 1040 sending a write request burst transaction to the slave 1050 via the channel 1000 with a single function call at triangle 2. The write request burst transaction may include a command field, a data field, a burst length field, an address field, and other OCP fields. The master 1040 may also set or change the master timing variables in the channel 1000 by calling a function in the channel 1000. The timing point B is the start of the write request transfer, write req 1012 The start of the first write data transfer, write data 1022, is calculated from timing point B and the timing variable RqDL. The master 1040 can send a single request and multiple write data blocks to the slave 1050 via the channel 1000 in a single function call, for example, triangle 2. The write request burst transaction ends when the slave 1050 accepts the write request burst by calling a function in the channel 1000 at triangle 3. The slave 1050 may set of change the slave timing variables by calling a function in the channel 1000. The slave 1050 sends a write response burst transaction via the channel 1000 with a single function call at triangle 4. This is timing point E in FIG. 10. Timing point E is the time of the start of the write response transfer, write resp 1032. The write response burst transaction may include a response status field, a burst length field, and other OCP fields. The write response burst transaction ends when the master 1040 accepts the write response burst transaction via the channel 1000 with a single function call at triangle 5. The burst transaction ends at timing point F3 with the single write response, write resp 1032, being received by the master 1040 from the slave 1050 via the channel 1000.

The channel 1000 stores timing variables set by the master 1040 and slave 1050. The channel 1000 provides timing helper functions that calculate derived timing information commonly needed by the master 1040 and slave 1050. Approximate timing points for each OCP transfer (e.g., request, data, and response transfers) can be calculated based on the timing variables stored in the channel 1000 and the derived timing information provided by the timing helper functions.

This invention has been described with reference to specific embodiments. It will, however, be evident to persons skilled in the art having the benefit of this disclosure that various modifications and changes may be made to these embodiments without departing from the broader spirit and scope of the invention. The specification and drawings are accordingly to be regarded in an illustrative rather than restrictive sense.

What is claimed is:

1. A non-transitory machine-readable storage medium having instructions stored thereon, which when executed by a machine, are configured to cause the machine to generate an apparatus, comprising:

an initiator module modeled as a first executable behavioral model;

a target module modeled as a second executable behavioral model, where information regarding a burst transaction is communicated between the initiator module and the target module of a System on a Chip through a communications channel, where the burst transaction consists of two or more individual transfers and the communications channel is separate and distinct from both the initiator module and the target module; and one or more timing function routines configured to obtain timing variables for the burst transaction that uses a communications protocol that includes distinct fields of a command field and a timing field for the burst transaction communicated between the initiator module and the target module, where the timing field includes 1) timing variables, or 2) derived timing information based on the timing variables, where either the initiator module or the target module use the one or more timing function routines to determine the timing information associated with each of the two or more individual transfers within the burst transaction during a simulation, by either 1) making a direct function call to the communications channel that the burst transaction passes through to retrieve information about the burst transaction including its timing information or 2) basing the timing information on the timing variables or the derived timing information contained in the timing field for the burst transaction, and then using the one or more timing function routines to derive timing information associated with each individual transfer within the burst transaction during the simulation, where the derived timing information associated with each individual transfer within the burst transaction is correlatable to give an accurate correlation to a clock cycle operation of the System on a Chip during the simulation.

2. The non-transitory machine-readable storage medium of claim 1, where the first executable behavioral model of the initiator module is also configured to make a second function call to retrieve information about the burst transaction including its timing information and use the one or more timing function routines to derive timing information associated with each individual transfer within the burst transaction during the simulation, and where data and commands are sent from one module to another module through function calls.

3. The non-transitory machine-readable storage medium of claim 2, where the first executable behavioral model of the initiator module uses a first timing function routine of the one or more timing function routines that is configured to use time annotated modeling to make the derived timing information associated with each individual transfer within a burst transaction cycle accurate to the clock cycle operation of the System on a Chip used during the simulation.

4. The non-transitory machine-readable storage medium of claim 1, wherein the timing information associated with a first individual transfer is derived separately from the timing information associated with a second individual transfer and where both the derived timing information associated with the first individual transfer within the burst transaction and the derived timing information associated with the second individual transfer within the burst transaction are correlatable to give the accurate correlation to the clock cycle operation of the System on the Chip during the simulation.

5. The non-transitory machine-readable storage medium of claim 4, where the burst transaction also has the command field and a data field to store the derived timing information associated with the burst transaction.

6. The non-transitory machine-readable storage medium of claim 1, where a model of the communications channel is configured to transport the burst transaction and estimate timing points for each request and response transfer associated with the burst transaction between the initiator module and the target module in the System on a Chip based on the burst transaction having one or more fields containing an accurate time annotation for the two or more individual transfers in the burst transaction.

7. The non-transitory machine-readable storage medium of claim 1, further comprising:

the communications channel is modeled as a third executable behavioral model that has one or more storage locations to store the timing variables associated with the burst transaction being communicated between the initiator module and the target module, where the target module as the second executable behavioral model is configured to make the direct function call to the communications channel to obtain the timing variables associated with the burst transaction.

8. The non-transitory machine-readable storage medium of claim 1, wherein the first executable behavioral model of the initiator module uses a routine to calculate timing points for a first transfer within the burst transaction based on the timing variables stored and timing information derived in a first timing variable function routine of the model of the communications channel.

9. The non-transitory machine-readable storage medium of claim 1, wherein the target module as the second executable behavioral model calculates timing points for a first transfer received within the burst transaction based on the timing variables stored and the timing information derived in the one or more timing variable functions of a communications channel model.

10. The non-transitory machine-readable storage medium of claim 1, wherein the first executable behavioral model of the initiator module is a transaction level model written in a SystemC language.

11. The non-transitory machine-readable storage medium of claim 6, wherein the model of the communications channel is configured as a time annotated Open Core Protocol (OCP) Transaction Level 2 (TL2) channel.

12. A method for modeling operation of a System on a Chip to provide time annotated transaction level modeling, comprising:

simulating transporting of burst transaction information including a plurality of transfers from a first model of an initiator module through a communications channel to a second model of a target module in the System on the Chip, wherein the communications channel is separate and distinct from both the initiator module and the target module;

maintaining a first set of timing variables associated with the initiator module;

using a communications protocol that includes distinct fields of a command field and a timing field for the burst transaction information communicated between the initiator module and the target module, where the timing field includes 1) timing variables, or 2) derived timing information based on the timing variables;

maintaining a second set of timing variables associated with the target module using one or more timing function routines to 1) obtain the first set and the second set of timing variables for the burst transaction information communicated between the initiator module and the target module, 2) derive timing information associated with a first individual transfer within the burst transaction during the simulation, and 3) derive timing information associated with a second individual transfer within the burst transaction during the simulation; and where the second model of the target module is configured to make a function call to retrieve information about the burst transaction including its timing information and is configured to use the one or more timing function routines to derive the timing information associated with the first individual transfer and the second individual transfer within the burst transaction during the simulation, where the derived timing information associated with each individual transfer within the burst transaction is correlatable to give an accurate correlation to a clock cycle operation of the System on the Chip during the simulation.

13. The method for modeling operation of the System on the Chip of claim 12, where the first model of the initiator module is configured to make the function call to retrieve information about the burst transaction including its timing information and use the one or more timing function routines to derive the timing information associated with each individual transfer within the burst transaction during the simulation, and where data and commands are sent from one module to another module through function calls.

14. The method for modeling operation of the System on the Chip of claim 13, where the first model of the initiator module uses a first timing function routine of the one or more timing function routines that is configured to use the time annotated transaction level modeling to make the timing information associated with each individual transfer within a burst transaction cycle accurate to the clock cycle operation of the System on the Chip used during the simulation, wherein the timing information associated with the first individual transfer is derived separately from the timing information associated with the second individual transfer.

15. The method for modeling operation of the System on the Chip of claim 12, where the burst transaction has a timing field and a burst information field to store timing information associated with the burst transaction.

16. The method for modeling operation of the System on the Chip of claim 12, where the burst transaction also has a command field and a data field to store timing information associated with the burst transaction.

17. The method for modeling operation of the System on the Chip of claim 12, where a model of the communications channel is configured to transport the burst transaction and estimate timing points for each request and response transfer associated with the burst transaction between the initiator module and the target module in the System on the Chip based on the burst transaction having one or more fields containing an accurate time annotation for transfers in the burst transaction.

18. The method for modeling operation of the System on the Chip of claim 12, further comprising:

simulating the communications channel modeled as an executable behavioral model that has one or more storage locations to store the first set and the second set of timing variables associated with the burst transaction being communicated between the initiator module and the target module, where the second model of the target module is configured to make the function call to the communications channel to obtain the second set of the timing variables associated with the burst transaction.

19. A computing system, comprising:

a processor component cooperating with a non-transitory machine readable storage medium, where the processor component is configured to execute instructions in a simulation to simulate an initiator module modeled as a first behavioral model that generates a first set of timing variables for a burst transaction;

a target module modeled as a second behavioral model that generates a second set of timing variables for each transfer in the burst transaction, where the initiator module and target module are part of a System on a Chip, where the System on the Chip is configured to use a communications protocol that includes distinct fields of a command field and a timing field for communication of the burst transaction information from the initiator module through a communications channel to the target module, where the burst transaction includes three or more transfers within the burst transaction and the communications channel is separate and distinct from both the initiator module and the target module; and one or more timing function routines to derive burst information for the three or more transfers in the burst transaction so that timing information for each transfer is cycle accurate to a clock cycle operation of the System on the Chip during the simulation, where the one or more timing function routines are configured to obtain timing variables from either the first or second set of timing variables for the burst transaction that use the communications protocol including its distinct fields of the command field and the timing field for the burst transaction, where the timing field includes 1) the timing variables from either the first or second set of timing variables for the burst transaction, or 2) derived timing information based on the timing variables, where the timing function routines obtain the timing variables from either the first or second set of timing variables for the burst transaction depending upon whether the target module or the initiator module generated the burst transaction, where either the initiator module or the target module use the one or more timing function routines to determine the timing information associated with each of the two or more individual transfers within the burst transaction during a simulation, by either 1) making a direct function call to the communications channel that the burst transaction passes through to retrieve information about the burst transaction including its timing information or 2) basing the timing information on the timing variables from either the first or second set of timing variables for the burst transaction or the derived timing information contained in the timing field for the burst transaction, and then using the one or more timing function routines to derive timing information associated with each individual transfer within the burst transaction during the simulation.

20. The computing system of claim 19, further comprising:

a channel module to store the first and second set of timing variables; and a processing module configured to calculate when each transfer in the burst transaction started on the channel module and a latency for each transfer crossing the channel module based on the first and second set of timing variables.

* * * * *